(12) United States Patent
Lee et al.

(10) Patent No.: US 10,121,977 B2
(45) Date of Patent: Nov. 6, 2018

(54) DISPLAY APPARATUS

(71) Applicant: Samsung Display Co., Ltd., Yongin-si, Gyeonggi-do (KR)

(72) Inventors: Sangjo Lee, Yongin-si (KR); Changyong Jeong, Yongin-si (KR); Yoonsun Choi, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/463,197

(22) Filed: Mar. 20, 2017

(65) Prior Publication Data

US 2018/0053905 A1    Feb. 22, 2018

(30) Foreign Application Priority Data

Aug. 19, 2016    (KR) .................. 10-2016-0105585

(51) Int. Cl.
*H01L 51/00* (2006.01)
*H01L 27/32* (2006.01)

(52) U.S. Cl.
CPC ...... *H01L 51/0097* (2013.01); *H01L 27/3262* (2013.01); *H01L 27/3272* (2013.01); *H01L 27/3276* (2013.01); *H01L 2251/5338* (2013.01)

(58) Field of Classification Search
CPC ............. H01L 51/0097; H01L 27/3262; H01L 27/3272; H01L 27/3276
See application file for complete search history.

(56) References Cited

U.S. PATENT DOCUMENTS

| 9,349,969 | B2 | 5/2016 | Kwon et al. |
| 9,490,215 | B2 | 11/2016 | Yang |
| 2014/0217397 | A1 | 8/2014 | Kwak et al. |
| 2014/0307396 | A1 | 10/2014 | Lee |
| 2017/0338296 | A1* | 11/2017 | Yamazaki ........... H01L 27/3276 |

FOREIGN PATENT DOCUMENTS

| KR | 10-2014-0064156 A | 5/2014 |
| KR | 10-2014-0099139 A | 8/2014 |
| KR | 10-2014-0099174 A | 8/2014 |
| KR | 10-2015-0059048 A | 5/2015 |

* cited by examiner

*Primary Examiner* — Victor A Mandala
*Assistant Examiner* — Colleen E Snow
(74) *Attorney, Agent, or Firm* — Innovation Counsel LLP

(57) ABSTRACT

Provided is a display apparatus capable of reducing generation of defects such as a disconnection during manufacturing processes, while ensuring longer lifespan thereof. The display apparatus includes: a substrate including a bending area between a first area and a second area to be bent in the bending area about a bending axis, the substrate including a first substrate and a second substrate that are stacked; a first intermediate line at least partially located in the bending area, and located between the first substrate and the second substrate; and a first upper line over the second substrate to be electrically connected to the first intermediate line via a first contact hole in the second substrate.

39 Claims, 12 Drawing Sheets

DISPLAY APPARATUS

CROSS-REFERENCE TO RELATED APPLICATION

This application claims the benefit of Korean Patent Application No. 10-2016-0105585, filed on Aug. 19, 2016, in the Korean Intellectual Property Office, the disclosure of which is incorporated herein in its entirety by reference.

BACKGROUND

1. Field

One or more embodiments relate to a display apparatus, and more particularly, to a display apparatus capable of reducing generation of defects such as disconnection during manufacturing processes while ensuring longer lifespan thereof.

2. Description of the Related Art

In general, a display apparatus includes a display unit on a substrate. In such a display apparatus, at least a part of the display apparatus may be bent to improve visibility at various angles or reduce an area of a non-display area.

However, according to a display apparatus of the related art, defects may occur, and the lifespan of the display apparatus may be reduced through processes of manufacturing the display apparatus that is bent.

SUMMARY

One or more embodiments include a display apparatus capable of reducing generation of defects such as disconnection during manufacturing processes, while ensuring longer lifespan of the display apparatus.

Additional aspects will be set forth in part in the description that follows and, in part, will be apparent from the description, or may be learned by practice of the presented embodiments.

According to one or more embodiments, a display apparatus includes: a substrate including a bending area between a first area and a second area to be bent in the bending area about a bending axis, the substrate including a first substrate and a second substrate that are stacked; a first intermediate line at least partially located in the bending area, and located between the first substrate and the second substrate; and a first upper line over the second substrate to be electrically connected to the first intermediate line via a first contact hole in the second substrate.

The first upper line may be at least partially located in the first area.

The display area may further include: a second intermediate line at least partially located in the bending area, and located between the first substrate and the second substrate; and a second upper line over the second substrate to be electrically connected to the second intermediate line via a second contact hole in the second substrate.

The portion of the first intermediate line overlapping the first contact hole and the portion of the second intermediate line overlapping the second contact hole may not be adjacent to each other in a direction crossing a direction in which the first intermediate line and the second intermediate line extend.

In the first intermediate line, a portion overlapping the first contact hole may have a width that is greater than a width of the other portion of the first intermediate line, and in the second intermediate line, a width of a portion overlapping the second contact hole may be greater than a width of the other portion of the second intermediate line, and wherein the portion of the first intermediate line overlapping the first contact hole and the portion of the second intermediate line overlapping the second contact hole may not be adjacent to each other in a direction crossing a direction in which the first intermediate line and the second intermediate line extend.

The display apparatus may further include a first additional line at least partially located in the second area, the first additional line over the second substrate being electrically connected to the first intermediate line via a first additional contact hole in the second substrate. The display apparatus may further include: a second intermediate line at least partially located in the bending area, and located between the first substrate and the second substrate; and a second additional line over the second substrate to be electrically connected to the second intermediate line via a second additional contact hole in the second substrate.

The first additional contact hole may be located within an upper surface of the first intermediate line.

The first area may include a display area, and an end of the first intermediate line in a direction opposite the display area may be farther from the display area than the first additional contact hole.

A portion of the first intermediate line that overlaps the first additional contact hole has a width that is greater than a width of the other portion of the first intermediate line.

The portion of the first intermediate line overlapping the first additional contact hole and the portion of the second intermediate line overlapping the second additional contact hole may not be adjacent to each other in a direction crossing a direction in which the first intermediate line and the second intermediate line extend.

The portion of the first intermediate line overlapping the first additional contact hole may have a width that is greater than a width of the other portion of the first intermediate line, and in the second intermediate line, a portion overlapping the second additional contact hole has a width that is greater than a width of the other portion of the second intermediate line, wherein the portion of the first intermediate line overlapping the first additional contact hole and the portion of the second intermediate line overlapping the second additional contact hole may not be adjacent to each other in a direction crossing a direction in which the first intermediate line and the second intermediate line extend.

The display apparatus may further include a first additional line at least partially located in the second area, the first additional line over the second substrate being electrically connected to the first intermediate line via a first additional contact hole in the second substrate.

The first additional contact hole may be located within an upper surface of the first additional line.

A portion of the first intermediate line, which corresponds to the first additional contact hole, may have a width that is greater than a width of the other portion of the first intermediate line.

The display apparatus may further include: a second intermediate line at least partially located in the bending area, and located between the first substrate and the second substrate; and a second additional line over the first substrate to be electrically connected to the second intermediate line via a second additional contact hole in the first substrate.

The portion of the first intermediate line overlapping the first additional contact hole and the portion of the second intermediate line overlapping the second additional contact hole may not be adjacent to each other in a direction crossing a direction in which the first intermediate line and the second intermediate line extend.

In the first additional line, a portion overlapping the first additional contact hole may have a width that is greater than a width of the other portion of the first additional line, and in the second additional line, a portion overlapping the second additional contact hole may have a width that is greater than a width of the other portion of the second additional line, and wherein the portion of the first additional line overlapping the first additional contact hole and the portion of the second additional line overlapping the second additional contact hole may not be adjacent to each other in a direction crossing a direction in which the first additional line and the second additional line extend.

The display apparatus may further include an electronic device over a surface of the first additional line, the surface of the first additional line being away from the second substrate. The substrate may be bent such that a part of the first substrate in the first area and at least a part of the first substrate in the second area face each other, and the display apparatus may further include a support layer between the parts of the first substrate facing each other and comprising a concave portion for accommodating the electronic device.

The first area may include a display area, and an end of the first intermediate line in a direction towards the display area may be closer to the display area than the first contact hole.

A portion of the first intermediate line overlapping the first contact hole may have a width that is greater than a width of the other portion of the first intermediate line.

The first intermediate line may include a plurality of through holes, wherein the plurality of through holes may be located in the bending area.

The first upper line may be electrically connected to the display device in the display area.

According to an aspect, a display apparatus includes: a substrate including a bending area between a first area and a second area to be bent in the bending area about a bending axis; a first intermediate line at least partially located in the bending area, and located over a lower surface of the substrate, wherein the lower surface of the substrate is an internal surface in the bending area; a first upper line over an upper surface of the substrate to be electrically connected to the first intermediate line via a first contact hole in the substrate; and a lower protective film covering the lower surface of the substrate and the first intermediate line.

The first upper line may be at least partially located in the first area.

The first area may include a display area, and an end of the first intermediate line in a direction towards the display area may be closer to the display area than the first contact hole.

A portion of the first intermediate line, which corresponds to the first contact hole, may have a width that is greater than a width of the other portion of the first intermediate line.

The display apparatus may further include: a second intermediate line at least partially located in the bending area, and arranged over the lower surface of the substrate, wherein the lower surface of the substrate is the internal surface in the bending area; and a second upper line at least partially located in the first area to be electrically connected to the second intermediate line via a second contact hole in the substrate.

The portion of the first intermediate line overlapping the first contact hole and the portion of the second intermediate line overlapping the second contact hole may not be adjacent to each other in a direction crossing a direction in which the first intermediate line and the second intermediate line extend.

In the first intermediate line, a portion overlapping the first contact hole may have a width that is greater than a width of the other portion of the first intermediate line, and in the second intermediate line, a portion overlapping the second contact hole may have a width that is greater than a width of the other portion of the second intermediate line, and wherein the portion of the first intermediate line overlapping the first contact hole and the portion of the second intermediate line overlapping the second contact hole may not be adjacent to each other in a direction crossing a direction in which the first intermediate line and the second intermediate line extend.

The display apparatus may further include a first additional line at least partially located in the second area, and arranged over the upper surface of the substrate to be electrically connected to the first intermediate line via a first additional contact hole in the substrate. The display apparatus may further include: a second intermediate line at least partially located in the bending area, and arranged over the lower surface of the substrate, wherein the lower surface of the substrate is the internal surface in the bending area; and a second additional line over the upper surface of the substrate to be electrically connected to the second intermediate line via a second additional contact hole in the substrate.

The portion of the first intermediate line overlapping the first additional contact hole and the portion of the second intermediate line overlapping the second additional contact hole may not be adjacent to each other in a direction crossing a direction in which the first intermediate line and the second intermediate line extend.

In the first intermediate line, a portion overlapping the first additional contact hole may have a width that is greater than a width of the other portion of the first intermediate line, and in the second intermediate line, a portion overlapping the second additional contact hole may have a width that is greater than a width of the other portion of the second intermediate line, and wherein the portion of the first intermediate line overlapping the first additional contact hole and the portion of the second intermediate line overlapping the second additional contact hole may not be adjacent to each other in a direction crossing a direction in which the first intermediate line and the second intermediate line extend.

The first additional contact hole may be located within an upper surface of the first intermediate line.

The first area may include a display area, and an end of the first intermediate line in a direction opposite the display area may be farther from the display area than the first additional contact hole.

In the first intermediate line, a portion overlapping the first additional contact hole may have a width that is greater than a width of the other portion of the first intermediate line.

A thickness of a portion in the substrate, wherein the portion corresponds to the first intermediate line, may be less than a thickness of other portion in the substrate. In a lower surface of the substrate, a portion adjacent to the first intermediate line may configure a continuous surface with a surface of the first intermediate line being away from the substrate.

The first intermediate line may include a plurality of through holes, wherein the plurality of through holes may be located in the bending area.

The first upper line may be electrically connected to the display device in the display area.

The display area may be throughout the first area, the bending area, and the second area. The display apparatus may further include a data line and a scan line that cross each other in the display area, wherein one of the data line and the scan line may be the first upper line, and the first upper line may be connected to the first intermediate line in a region where the data line and the scan line cross each other such that the data line and the scan line do not directly contact each other.

The display apparatus may further include: a thin film transistor over the second substrate to be located in at least one of the first area, the bending area, and the second area; and a shielding layer located between the first substrate and the second substrate to correspond to the thin film transistor to prevent external light from reaching the thin film transistor, wherein the shielding layer may include a same material as that of the first intermediate line.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
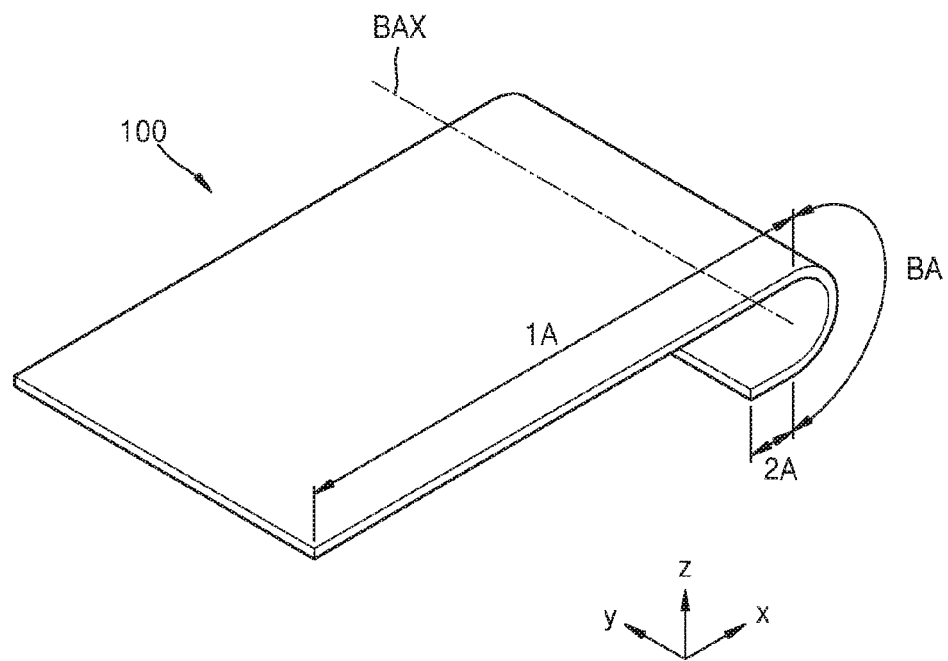
FIG. 1 is a schematic perspective view of a part of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, the present disclosure will be described in detail by explaining preferred embodiments of the inventive concept with reference to the attached drawings. Like reference numerals in the drawings denote like elements.

Sizes of components in the drawings may be exaggerated for convenience of explanation. In other words, since sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Figure 2:
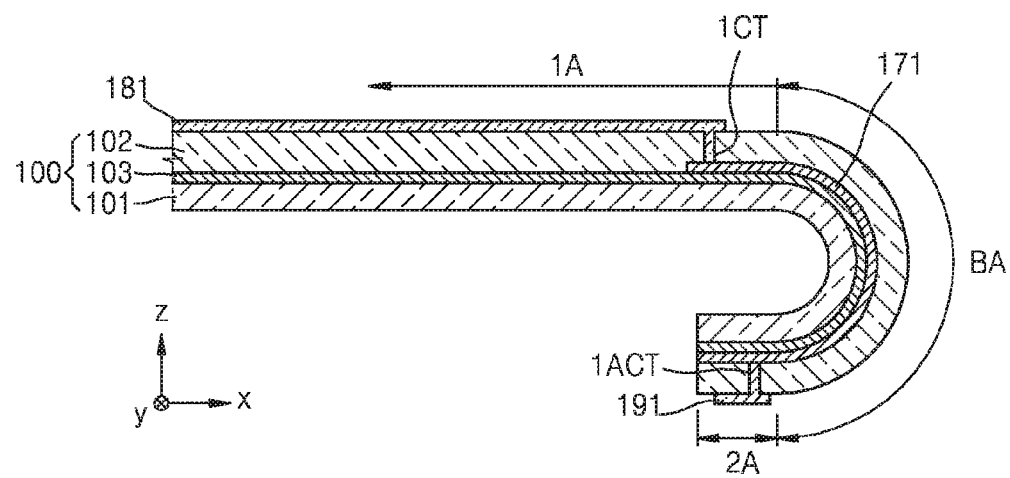
FIG. 2 is a schematic cross-sectional view of a part of the display apparatus of FIG. 1.

FIG. 1 is a schematic perspective view of a part of a display apparatus according to an embodiment, and FIG. 2 is a schematic cross-sectional view of a part of the display apparatus of FIG. 1.

In the display apparatus according to the embodiment, a substrate 100 that is a part of the display apparatus is partially bent, and thus, the display apparatus also has a partially bent shape like the substrate 100. In detail, the substrate 100 in the display apparatus according to the embodiment has a bending area BA extending in a first direction (+y direction). The bending area BA is between a first area 1A and a second area 2A in a second direction (+x direction) crossing the first direction. In addition, the substrate 100 is bent about a bending axis BAX that extends in the first direction (+y direction), as shown in FIG. 1. The substrate 100 may include various materials having flexible or bendable characteristics, e.g., polymer resins such as polyethersulphone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), and cellulose acetate propionate (CAP).

In more detail, the substrate 100 may have a multi-layered structure, as shown in FIG. 2. That is, the substrate 100 may include a first substrate 101 and a second substrate 102 stacked on each other. Each of the first substrate 101 and the second substrate 102 may include the polymer resins that are described above. The substrate 100 may further include additional layers, in some cases. In FIG. 2, the substrate 100 may further include a barrier layer 103 between the first substrate 101 and the second substrate 102. The barrier layer 103 may be, for example, a thin inorganic layer including silicon oxide, silicon nitride, silicon oxynitride, amorphous silicon, crystalline silicon, aluminum oxide, and/or hafnium silicate. The barrier layer 103 may prevent impurities from infiltrating into a display unit (not shown) via the first substrate 101 and/or the second substrate 102.

The first area 1A includes a display area (not shown). The first area 1A may also include a part of a non-display area outside the display area, in addition to the display area. In some cases, the display area may extend to the bending area BA. The second area 2A includes the non-display area.

The display apparatus as described above includes a first intermediate line 171 and a first upper line 181, as shown in FIG. 2.

The first intermediate line 171 is at least partially located in the bending area BA. In detail, as shown in FIG. 2, the first intermediate line 171 may extend in the first area 1A and the second area 2A, as well as the bending area BA. The first intermediate line 171 is between the first substrate 101 and the second substrate 102.

The first upper line 181 is at least partially located in the first area 1A. In FIG. 2, the first upper line 181 is entirely located only in the first area 1A. The first upper line 181 is located on the second substrate 102, and in particular, on a surface of the second substrate 102 that is opposite to a direction towards the first substrate 101. In some cases, another layer may be between the first upper line 181 and the second substrate 102. The first upper line 181 is electrically connected to the first intermediate line 171 between the first substrate 101 and the second substrate 102, via a first contact hole 1CT in the second substrate 102. In FIG. 2, the first upper line 181 is shown to completely fill the first contact hole 1CT to be directly in contact with the first intermediate line 171.

In FIGS. 1 and 2, the substrate 100 is bent at the bending area BA, and thus, in manufacturing processes of the display apparatus, various components of the display apparatus are manufactured in a state in which the substrate 100 is flat, and after that, the substrate 100 is bent at the bending area BA so that the display apparatus may have a shape shown in FIGS. 1 and 2. Here, while the substrate 100 is bent at the bending area BA, stress may be applied to the components in the bending area BA. However, in the display apparatus according to the embodiment, generation of defects in the first intermediate line 171 during the bending process may be prevented or reduced.

In detail, as shown in FIG. 2, since the first intermediate line 171 is between the first substrate 101 and the second substrate 102, the first intermediate line 171 is located at about a center of the substrate 100 in the entire substrate 100. Therefore, when the substrate 100 is bent at the bending area BA, a neutral plane is located at the position where the first intermediate line 171 is located or around the first intermediate line 171. Thus, although stress may be applied to the components in the bending area BA while bending the substrate 100 at the bending area BA, stress may not be applied to the first intermediate line 171 located at or around the neutral plane. Even if stress is applied to the first intermediate line 171, the stress applied to the first intermediate line 171 may be reduced. As such, damage to the first intermediate line 171 may be prevented or reduced.

The first upper line 181 on the substrate 100 allows electric signals to be transferred to the display area above the substrate 100. Since the first upper line 181 is located in the first area 1A, not in the bending area BA, as shown in FIG. 2, the first upper line 181 is not damaged by the bending of the substrate 100. The first upper line 181 is electrically connected to the first intermediate line 171 via the first contact hole 1CT in the second substrate 102, as described above. The first upper line 181 may extend to the bending area BA, as well as the first area 1A. In this case, the first upper line 181 is electrically connected to the first intermediate line 171 via the first contact hole 1CT that is located in the first area 1A, not the bending area BA, and thus, even if a part of the first upper line 181 in the bending area BA is damaged due to stress, it would not affect the performance of the display apparatus.

In addition, as shown in FIG. 2, the display apparatus according to the embodiment may further include a first additional line 191 that is at least partially located in the second area 2A. The first additional line 191 may be located on the surface of the second substrate 102, opposite to the direction towards the first substrate 101, like the first upper line 181.

The first additional line 191 is at least partially located in the second area 2A. In FIG. 2, the first additional line 191 is entirely located only in the second area 2A. The first additional line 191 is located above the second substrate 102, and in particular, on a surface opposite the first substrate 101. In some cases, another layer may be between the first additional line 191 and the second substrate 102. The first additional line 191 is electrically connected to the first intermediate line 171 between the first substrate 101 and the second substrate 102, via a first additional contact hole 1ACT in the second substrate 102. In FIG. 2, the first additional line 191 fills the first additional contact hole 1ACT to directly contact the first intermediate line 171.

At least a part of the first additional line 191 may be understood as a pad portion. Accordingly, an electronic device (not shown) such as a printed circuit board or an integrated circuit may be electrically connected to the first additional line 191 via an anisotropic conductive film (ACF). Thus, electric signals from the electronic device such as the printed circuit board or the integrated circuit may be transferred to the display device via the first additional line 191, the first intermediate line 171, and the first upper line 181.

As shown in FIG. 2, since the first additional line 191 is above the second area 2A, not above the bending area BA, the first additional line 191 may not be damaged by the bending of the substrate 100. The first additional line 191 may extend to the bending area BA, as well as the second area 2A. In this case, the first additional line 191 is electrically connected to the first intermediate line 171 via the first additional contact hole 1ACT in the second area 2A, not in the bending area BA, and accordingly, even if a part of the first additional line 191 above the bending area BA is damaged due to stress, it would not affect the performance of the display apparatus.

A method of manufacturing the display apparatus according to the embodiment will be described briefly as follows.

First, the first substrate 101 is formed on a carrier substrate (not shown) having a hardness that is sufficient enough to act as a support during the manufacturing processes. This may be performed by locating a polymer resin as described above on the carrier substrate. After that, the barrier layer 103 is formed by a process such as deposition on the first substrate 101, and a conductive material such as metal is positioned on the barrier layer 103 by the method such as deposition to form the first intermediate line 171. A mask may be used during the above processes so as to form the first intermediate line 171 that extends to a portion of the first area 1A adjacent to the bending area BA and/or a portion of the second area 2A adjacent to the bending area BA. Alternatively, in some embodiments, a conductive layer may be formed on an entire surface of the barrier layer 103 and patterned to form the first intermediate line 171.

After that, the polymer resin as described above is located on the barrier layer 103 to cover the first intermediate line 171 so as to form the second substrate 102. In addition, the first contact hole 1CT and/or the first additional contact hole 1ACT is formed in the second substrate 102 to partially expose the first intermediate line 171. For example, as shown in FIG. 2, the first contact hole 1CT and the first additional contact hole 1ACT may be formed in the second substrate 102 so as to respectively expose portions of the first intermediate line 171 corresponding to the first area 1A and the second area 2A. The first contact hole 1CT and/or the first additional contact hole 1ACT may be formed by various methods, for example, an etching method may be performed by using photoresist, or a laser beam may be irradiated to the second substrate 102 to partially remove the second substrate 102.

After forming the first contact hole 1CT and/or the first additional contact hole 1ACT, a conductive material such as metal is located on the second substrate 102 by the method such as deposition to form the first upper line 181. In this process, a mask may be used to form the first upper line 181 at least in the first area 1A. Alternatively, in some embodiments, a conductive layer may be formed on an entire surface of the second substrate 102 and patterned to form the first upper line 181. As described above, a material forming the first upper line 181 may fill the first contact hole 1CT while the first upper line 181 is formed, and accordingly, the first upper line 181 may be electrically connected to the first intermediate line 171 via the first contact hole 1CT.

When the first upper line 181 is formed, the first additional line 191 may be simultaneously formed. In this case, during forming the first upper line 181 and the first additional line 191, materials forming the first upper line 181 and the first additional line 191 may fill the first additional contact hole 1ACT, as well as the first contact hole 1CT, and thus, the first upper line 181 and the first additional line 191 may be electrically connected to the first intermediate line 171 via the first contact hole 1CT and the first additional contact hole 1ACT.

The first upper line 181 and/or the first additional line 191 as described above may be formed simultaneously when a component of the display unit on the substrate 100 is fabricated. If another layer is formed on the substrate 100 and the first upper line 181 and/or the first additional line 191 is located on the other layer, contact holes corresponding to the first contact hole 1CT and/or the first additional contact hole 1ACT are formed in the other layer, and then the first upper line 181 and/or the first additional line 191 is formed. Alternatively, in some embodiments, another layer is formed before forming the first contact hole 1CT and/or the first additional contact hole 1ACT in the second substrate 102, and then the first contact hole 1CT and/or the first additional contact hole 1ACT is formed throughout the second substrate 102 and the other layer, and the first upper line 181 and/or the first additional line 191 may be formed.

In the above description, it is described that the barrier layer 103 is formed on the first substrate 101, the first intermediate line 171 is formed on the barrier layer 103, and then, the second substrate 102 is formed, but one or more embodiments are not limited thereto. For example, the first intermediate line 171 may be formed on the first substrate 101, the barrier layer 103 may be formed on the entire surface of the first substrate 101 to cover the first intermediate line 171, and after that, the second substrate 102 may be formed on the barrier layer 103. In this case, the first contact hole 1CT and/or the first additional contact hole 1ACT may be formed through the barrier layer 103, as well as the second substrate 102. If the first intermediate line 171 and the second substrate 102 directly contact each other, an adhesive force between the first intermediate line 171 and the second substrate 102 may be weakened. Thus, the barrier layer 103 may be located between the first intermediate line 171 and the second substrate 102 to prevent the adhesive force from weakening. However, various modifications may be applied, for example, barrier layers may be located both above and below the first intermediate line 171.

Figure 3:
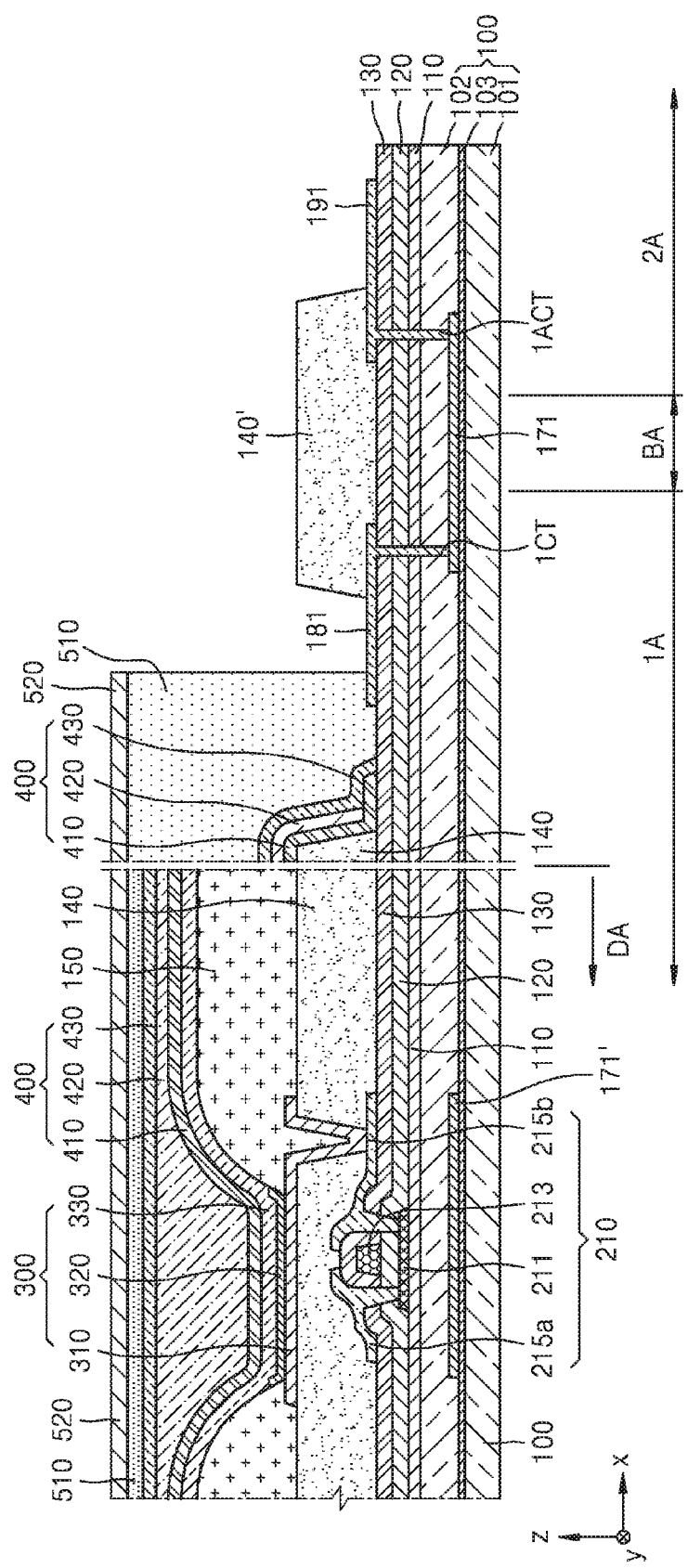
FIG. 3 is a schematic cross-sectional view of a part of a display apparatus according to an embodiment.

FIG. 3 is a schematic cross-sectional view of a part of a display apparatus according to an embodiment.

The display apparatus according to the embodiment includes the substrate 100 including the first substrate 101, the second substrate 102, and the barrier layer 103, as described above. The substrate 100 has the bending area BA extending in the first direction (+y direction). The bending area BA is between the first area 1A and the second area 2A in the second direction (+x direction) crossing the first direction. In addition, the substrate 100 is bent about a bending axis that extends in the first direction (+y direction) in the bending area BA. However, for convenience of description, the display apparatus is not bent in FIG. 3. In some of the cross-sectional views or plan views related to embodiments that will be described later, the display apparatus is not in a bent state for convenience of description. The first intermediate line 171 is between the first substrate 101 and the second substrate 102 of the substrate 100. Forming of the first intermediate line 171 is described above with reference to FIG. 2.

The first area 1A includes a display area DA. As shown in FIG. 3, the first area 1A may also include a part of a non-display area outside the display area DA, in addition to the display area DA. In some cases, the display area DA may extend to the bending area BA. The second area 2A includes the non-display area.

In the display area DA of the substrate 100, a display device 300 and a thin film transistor 210 may be located, wherein the display device 300 is electrically connected to the thin film transistor 210, as shown in FIG. 3. In FIG. 3, an organic light-emitting device is located in the display area DA as the display device 300. Electric connection of the organic light-emitting device to the thin film transistor 210 may include a pixel electrode 310 being electrically connected to the thin film transistor 210. In some cases, a thin film transistor (not shown) may also be in a peripheral area outside the display area DA of the substrate 100. The thin film transistor in the peripheral area may be, for example, a part of a circuit unit for controlling electric signals that are applied to the display area DA.

The thin film transistor 210 may include a semiconductor layer 211, a gate electrode 213, a source electrode 215a, and a drain electrode 215b. The semiconductor layer 211 may include amorphous silicon, polycrystalline silicon, or an organic semiconductor material. To ensure insulation between the semiconductor layer 211 and the gate electrode 213, a gate insulating layer 120 may be between the semiconductor layer 211 and the gate electrode 213, wherein the gate insulating layer 120 includes an inorganic material such as silicon oxide, silicon nitride, and/or silicon oxynitride. In addition, an interlayer insulating layer 130 may be on the gate electrode 213, and the source electrode 215a and the drain electrode 215b may be on the interlayer insulating layer 130, wherein the interlayer insulating layer 130 includes an inorganic material such as silicon oxide, silicon nitride, and/or silicon oxynitride. The insulating layers including the inorganic material may be formed by chemical vapor deposition (CVD) or atomic layer deposition (ALD).

This may be applied to other embodiments and modifications thereof that will be described later.

A buffer layer 110 may be between the thin film transistor 210 having the above structure and the substrate 100, wherein the buffer layer 110 may include an inorganic material such as silicon oxide, silicon nitride, and/or silicon oxynitride. The buffer layer 110 may improve smoothness of an upper surface of the substrate 100, and prevent or reduce infiltration of impurities from the substrate 100 into the semiconductor layer 211 of the thin film transistor 210.

A planarization layer 140 may be arranged on the thin film transistor 210. For example, as shown in FIG. 3, when the organic light-emitting device is arranged on the thin film transistor 210, the planarization layer 140 may planarize an upper portion of a protective layer that covers the thin film transistor 210. The planarization layer 140 may include, for example, an organic material such as acryl, benzocyclobutene (BCB), and hexamethyldisiloxane (HMDSO). In FIG. 3, although the planarization layer 140 has a single-layered structure, the planarization layer 140 may be variously modified; for example, the planarization layer 140 may have a multi-layered structure.

In addition, as shown in FIG. 3, the planarization layer 140 may exist in the second area 2A. In FIG. 3, a planarization layer 140' is located in the second area 2A. The planarization layer 140' located in the second area 2A may protect the first intermediate line 171 or may at least partially cover the first upper line 181 and/or the first additional line 191 to protect the first upper line 181 and/or the first additional line 191. In particular, as shown in FIG. 3, the planarization layer 140' covers above the first contact hole 1CT or the first additional contact hole 1ACT through which the first upper line 181 and the first additional line 191 are connected to the first intermediate line 171, and thus, infiltration of impurities through the first contact hole 1CT or the first additional contact hole 1ACT and damage to the first intermediate line 171 may be prevented.

In this case, the planarization layer 140 in the display area DA may be physically isolated from the planarization layer 140' in the second area 2A, in order to prevent impurities infiltrated from outside from reaching the inside of the display area DA via the planarization layer.

In the display area DA of the substrate 100, the organic light-emitting device may be on the planarization layer 140, wherein the organic light-emitting device includes the pixel electrode 310, an opposite electrode 330, and an intermediate layer 320 between the pixel electrode 310 and the opposite electrode 330 and including an emission layer. The pixel electrode 310 may contact one of the source electrode 215a and the drain electrode 215b via an opening formed in the planarization layer 140 and be electrically connected to the thin film transistor 210, as shown in FIG. 3.

A pixel-defining layer 150 may be on the planarization layer 140. The pixel-defining layer 150 includes openings corresponding respectively to sub-pixels, that is, at least an opening exposing a center portion of the pixel electrode 310, to define pixels. Also, in the example shown in FIG. 3, the pixel-defining layer 150 increases a distance between an edge of the pixel electrode 310 and the opposite electrode 330 above the pixel electrode 310 so as to prevent an arc from generating at the edge of the pixel electrode 310. The pixel-defining layer 150 may include an organic material, for example, PI or hexamethyldisiloxane (HMDSO).

The intermediate layer 320 of the organic light-emitting device may include low-molecular weight organic materials or polymer materials. When the intermediate layer 320 includes a low-molecular weight organic material, the intermediate layer 320 may include a hole injection layer (HIL), a hole transport layer (HTL), an emission layer (EML), an electron transport layer (ETL), and an electron injection layer (EIL) in a single or multiple-layered structure, and examples of organic materials may include copper phthalocyanine (CuPc), N,N'-Di(naphthalene-1-yl)-N,N'-diphenyl-benzidine (NPB), and tris-8-hydroxyquinoline aluminum ($Alq_3$). The low-molecular weight organic materials may be deposited by a vacuum deposition method.

When the intermediate layer 320 includes a polymer material, the intermediate layer 320 may include an HTL and an EML. Here, the HTL may include PEDOT, and the EML may include a poly-phenylenevinylene (PPV)-based or polyfluorene-based polymer material. The intermediate layer 320 above may be formed by a screen printing method, an inkjet printing method, or a laser induced thermal imaging (LITI) method.

However, the intermediate layer 320 is not limited to the above example, and may have various structures. In addition, the intermediate layer 320 may include a layer that is integrally formed throughout a plurality of pixel electrodes 310, or a layer that is patterned to correspond to each of the plurality of pixel electrodes 310.

The opposite electrode 330 is arranged above the display area DA, and as shown in FIG. 3, may cover the display area DA. That is, the opposite electrode 330 may be integrally formed with respect to a plurality of organic light-emitting devices, so as to correspond to a plurality of pixel electrodes 310.

Since the organic light-emitting device may be easily damaged by external moisture or oxygen, an encapsulation layer 400 may cover the organic light-emitting device to protect the organic light-emitting device. The encapsulation layer 400 covers the display area DA, and may also extend outside the display area DA. The encapsulation layer 400 may include a first inorganic encapsulation layer 410, an organic encapsulation layer 420, and a second inorganic encapsulation layer 430, as shown in FIG. 3.

The first inorganic encapsulation layer 410 covers the opposite electrode 330, and may include silicon oxide, silicon nitride, and/or silicon oxynitride. In some cases, another layer such as a capping layer may be between the first inorganic encapsulation layer 410 and the opposite electrode 330. Since the first inorganic encapsulation layer 410 is formed according to a structure thereunder, the first inorganic encapsulation layer 410 may have an uneven upper surface, as shown in FIG. 3. The organic encapsulation layer 420 covers the first inorganic encapsulation layer 410, and unlike the first inorganic encapsulation layer 410, the organic encapsulation layer 420 may have an even upper surface. In more detail, the organic encapsulation layer 420 may substantially have an even upper surface at a portion corresponding to the display area DA. The organic encapsulation layer 420 may include at least one material selected from the group consisting of PET, PEN, PC, PI, polyethylene sulfonate, polyoxymethylene, polyarylate, and hexamethyldisiloxane. The second inorganic encapsulation layer 430 covers the organic encapsulation layer 420, and may include silicon oxide, silicon nitride, and/or silicon oxynitride. The second inorganic encapsulation layer 430 may contact the first inorganic encapsulation layer 410 at an edge thereof outside the display area DA, so as not to expose the organic encapsulation layer 420 to the outside.

As described above, since the encapsulation layer 400 includes the first inorganic encapsulation layer 410, the organic encapsulation layer 420, and the second inorganic encapsulation layer 430, even if there is a crack in the encapsulation layer 400 in the above multi-layered structure, the crack may be disconnected between the first inorganic encapsulation layer 410 and the organic encapsulation layer 420 or between the organic encapsulation layer 420 and the second inorganic encapsulation layer 430. As such, forming a path through which external moisture or oxygen may infiltrate into the display area DA may be prevented or reduced.

In some cases, a touch electrode having various patterns for executing a touchscreen function or a touch protective layer for protecting the touch electrode may be formed on the encapsulation layer 400. Such above touch electrode or the touch protective layer may be formed on the encapsulation layer 400 by a deposition process. One or more embodiments may not be limited thereto, that is, a touch panel prepared in advance and including a touch electrode may be attached to the encapsulation layer 400 so that the display apparatus may have the touch screen function.

A polarization plate 520 may be on the encapsulation layer 400 via an optically clear adhesive (OCA) 510. The polarization plate 520 may reduce reflection of external light. For example, when the external light that passed through the polarization plate 520 is reflected by an upper surface of the opposite electrode 330 and then passes through the polarization plate 520 again, the external light passes through the polarization plate 520 twice, and a phase of the external light may be changed. Therefore, a phase of the reflected light is different from the phase of the external light entering the polarization plate 520, and thus destructive interference occurs, and accordingly, the reflection of the external light may be reduced and visibility may be improved. The OCA 510 and the polarization plate 520 may cover an opening in the planarization layer 140, as shown in FIG. 3. The display apparatus according to one or more embodiments may not include the polarization plate 520, and in some cases, the polarization plate 520 may be omitted or replaced by other elements. For example, the polarization plate 520 may be omitted, and a black matrix and a color filter may be used to reduce reflection of external light.

During the manufacturing processes, the first contact hole 1CT and/or the first additional contact hole 1ACT may be formed in the second substrate 102 before forming the first upper line 181 and/or the first additional line 191. The first contact hole 1CT and/or the first additional contact hole 1ACT in the second substrate 102 may be fabricated by various methods; for example, a preset portion of the second substrate 102 may be etched by using photoresist or a laser beam may be irradiated to the second substrate 102 to remove a part of the second substrate 102. In particular, since the second substrate 102 includes polymer resin, the laser beam may be used. In a case in which the first contact hole 1CT and/or the first additional contact hole 1ACT is formed by a laser ablation technique (LAT) using a laser beam, an angle between an internal side surface of the first contact hole 1CT and/or the first additional contact hole 1ACT and the substrate 100 is closer to 90° than an angle between an internal side surface of contact holes formed by using photoresist and the substrate 100. Examples of the contact holes formed by using photoresist are the contact holes formed to allow the source electrode 215a and the drain electrode 215b to contact the semiconductor layer 211.

As described above, although FIG. 3 shows a state in which the substrate 100 is not bent for convenience of description, the substrate 100 is actually bent at the bending area BA, as shown in FIG. 2. The bending operation is performed after forming the display device 300 in the manufacturing processes. Thus, in the display apparatus according to the embodiment, generation of defects in the first intermediate line 171 during the bending process may be prevented or reduced.

In detail, as shown in FIG. 3, since the first intermediate line 171 is between the first substrate 101 and the second substrate 102, the first intermediate line 171 is located at about a center of the substrate 100 in the entire substrate 100. Therefore, when the substrate 100 is bent at the bending area BA, a neutral plane is located at a portion where the first intermediate line 171 positioned or around the first intermediate line 171. Therefore, although stress may be applied to components in the bending area BA when the substrate 100 is bent at the bending area BA, stress may not be applied or may be reduced on the first intermediate line 171 that is located at the neutral plane or around the neutral plane. As such, damage to the first intermediate line 171 may be reduced or prevented.

Since the first upper line 181 or the first additional line 191 located on the substrate 100 for transferring electric signals to the display area on the substrate 100 is in the first area 1A or the second area 2A, rather than in the bending area BA, as shown in FIG. 3, the first upper line 181 or the first additional line 191 is not damaged due to the bending of the substrate 100. The first upper line 181 and the first additional line 191 may extend to the bending area BA, as well as the first area 1A or the second area 2A. In this case, the first upper line 181 and the first additional line 191 are electrically connected to the first intermediate line 171 via the first contact hole 1CT and the first additional contact hole 1ACT in the first area 1A and the second area 2A, not in the bending area BA, and thus, even if the portions of the first upper line 181 and the first additional line 191 in the bending area BA are damaged due to stress, performance of the display apparatus may not be affected by the damage.

At least a part of the first additional line 191 may be understood as a pad portion. Accordingly, an electronic device (not shown) such as a printed circuit board or an integrated circuit may be electrically connected to the first additional line 191 via an ACF. Thus, electric signals from the electronic device such as the printed circuit board or the integrated circuit may be transferred to the display device via the first additional line 191, the first intermediate line 171, and the first upper line 181. In FIG. 3, the first upper line 181 is not electrically connected to the display device or the thin film transistor for convenience of description, but the first upper line 181 may be electrically connected to the display device or the thin film transistor.

The first contact hole 1CT, through which the first intermediate line 171 and the first upper line 181 are connected, is located in the first area 1A, not in the bending area BA, and thus, the first contact hole 1CT may be located outside the display area DA, as shown in FIG. 3, or may be located in the display area DA. In the latter case, the first intermediate line 171 is in the bending area BA, and at the same time, may extend to the display area DA.

In addition, as shown in FIG. 3, the display apparatus may further include an additional intermediate line 171' located in the display area DA. The additional intermediate line 171' is located in the display area DA, and may be disposed between the first substrate 101 and the second substrate 102. The additional intermediate line 171' is located to correspond to the thin film transistor 210 and acts as a shielding layer that may prevent external light from passing through the substrate 100 and reaching the thin film transistor 210. The additional intermediate line 171' may also act as an electrode or another line of a capacitor. In the above-described various structures, thicknesses of the first substrate 101 and the second substrate 102 on and under the additional intermediate line 171' may be adjusted to form the neutral plane on the additional intermediate line 171'. Additionally, a sum of thicknesses of the second substrate 102 and the buffer layer 110 may be adjusted to be greater than a sum of thicknesses of the gate insulating layer 120 and the interlayer insulating layer 130 so as to increase a distance between conductive layers, and thus, parasitic capacitance may be reduced. The additional intermediate line 171' may be formed simultaneously with the first intermediate line 171 by using the same material as the first intermediate line 171, during the manufacturing processes of the display apparatus.

Figure 4:
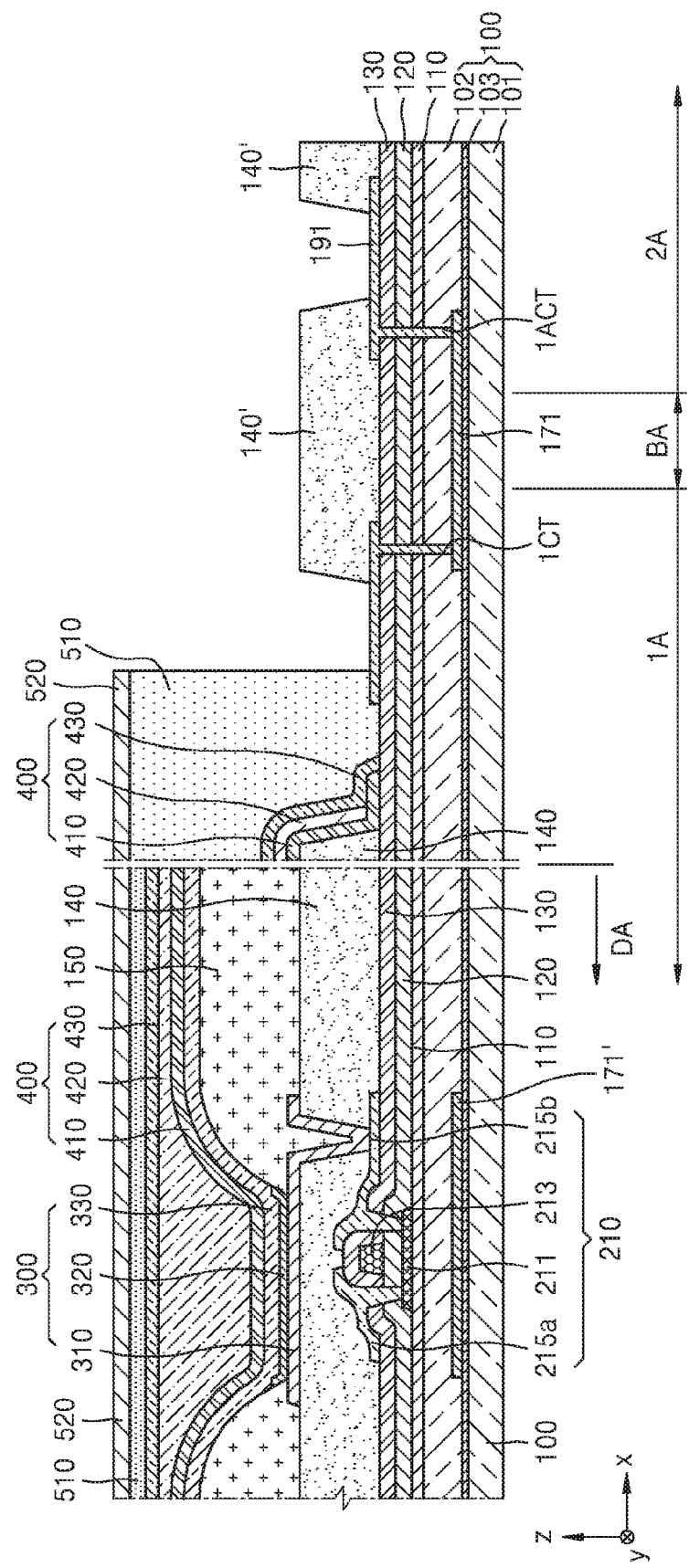
FIG. 4 is a schematic cross-sectional view of a part of a display apparatus according to an embodiment.

In FIG. 3, a portion of the first additional line 191 corresponding or adjacent to the bending area BA is only shown to be covered by the planarization layer 140', but one or more embodiments are not limited thereto. For example, as shown in FIG. 4 that is a schematic cross-sectional view of a part of a display apparatus according to another embodiment, the planarization layer 140' may cover all edges of the first additional line 191, and may have an opening that exposes a center portion of the first additional line 191. The first additional line 191 may act as a pad electrically connected to an electric device such as a driving chip or a printed circuit board.

Figure 5:
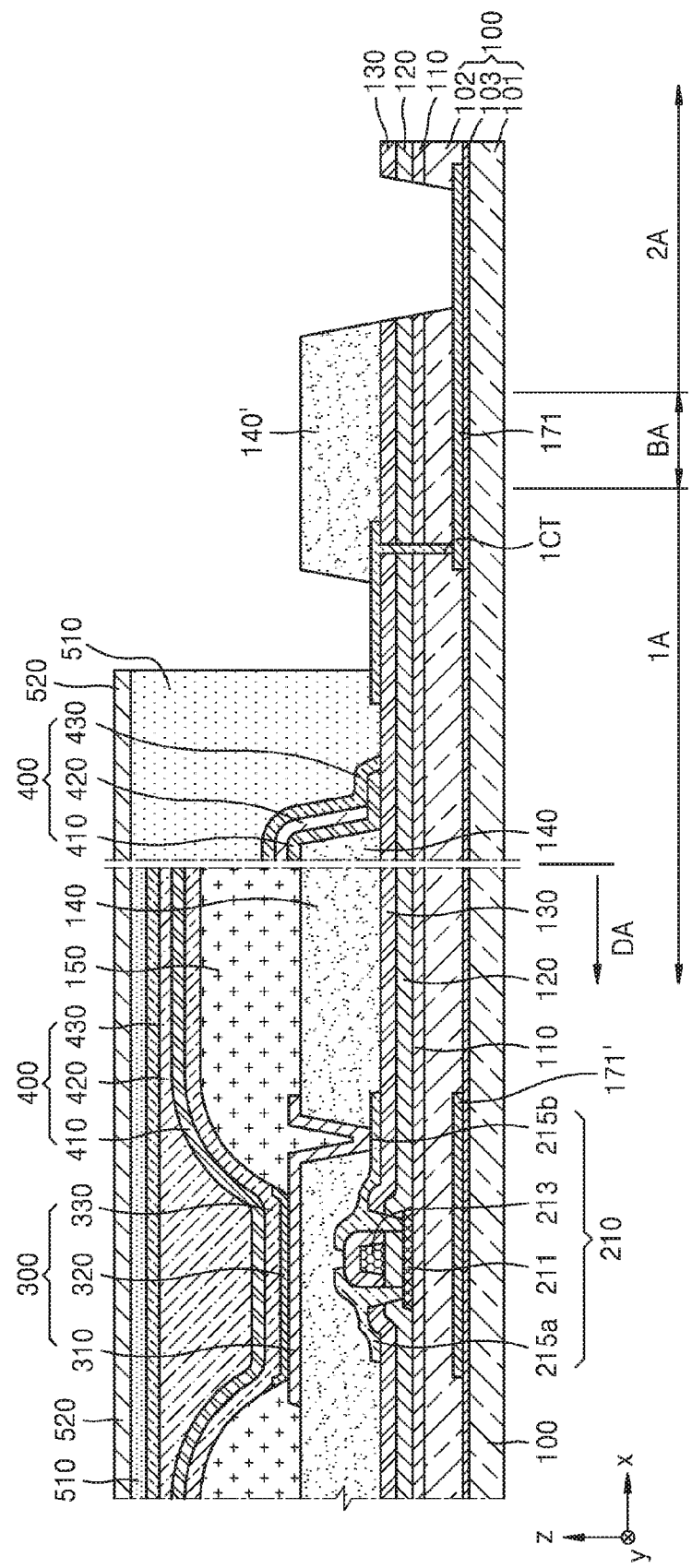
FIG. 5 is a schematic cross-sectional view of a part of a display apparatus according to an embodiment.

Alternatively, as shown in FIG. 5 that is a schematic cross-sectional view of a part of a display apparatus according to another embodiment, the display apparatus may not include the first additional line 191, and the first intermediate line 171 may act as a pad. In this case, the first intermediate line 171 sufficiently extends to the second area 2A, and the buffer layer 110, the gate insulating layer 120, the interlayer insulating layer 130, and the second substrate 102 are partially removed to partially expose the first intermediate line 171. As described above, the exposed portion of the first intermediate line 171 may act as a pad that is electrically connected to an electric device such as a driving chip or a printed circuit board.

Figure 6:
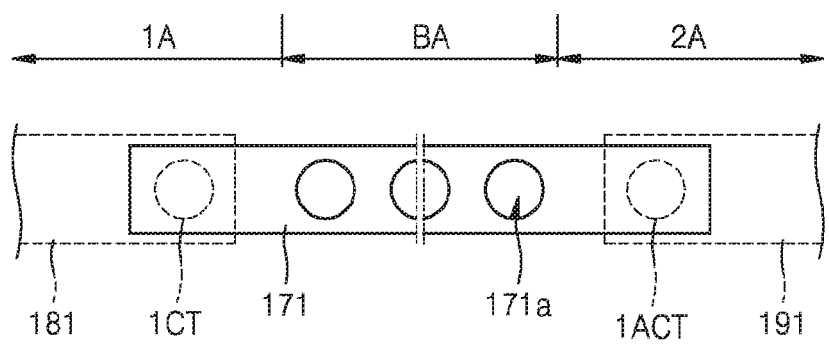
FIG. 6 is a schematic plan view of a part of a display apparatus according to an embodiment.

FIG. 6 is a schematic plan view of a part of a display apparatus according to another embodiment. As shown in FIG. 6, the first contact hole 1CT may be within an upper surface of the first intermediate line 171. As described above, since the first contact hole 1CT may be formed by LAT, when the first contact hole 1CT is formed in the surface of the first intermediate line 171, irradiation of the laser beam onto the first substrate 101 under the first intermediate line 171 and damage to the first substrate 101 may be prevented, because the first intermediate line 171 including metal may block the laser beam. In the display apparatus according to the embodiment, the first area 1A may include the display area DA, and an end of the first intermediate line 171 in a direction towards the display area DA may be closer to the display area DA than the first contact hole 1CT. Accordingly, the first contact hole 1CT may be easily located within the surface of the first intermediate line 171. Likewise, the first additional contact hole 1ACT may also be located within the surface of the first intermediate line 171. In this case, an end of the first intermediate line 171 in a direction opposite the display area DA may be farther from the display area DA than the first additional contact hole 1ACT. Accordingly, the first additional contact hole 1ACT may be easily located within the surface of the first intermediate line 171.

In FIG. 6, the first intermediate line 171 is shown to be flat for convenience of description, but the first intermediate line 171 is bent at the bending area BA with the first substrate 101 and the second substrate 102. As described above, since the first intermediate line 171 is located at the neutral plane or around the neutral plane, damage to the first intermediate line 171 due to the bending may be prevented or reduced. Moreover, as shown in FIG. 6, the first intermediate line 171 may include a plurality of through holes 171a. As such, the strength of the first intermediate line 171 may be reduced so that the first intermediate line 171 may be smoothly bent. The plurality of through holes 171a may be only located in the bending area BA.

Figure 7:
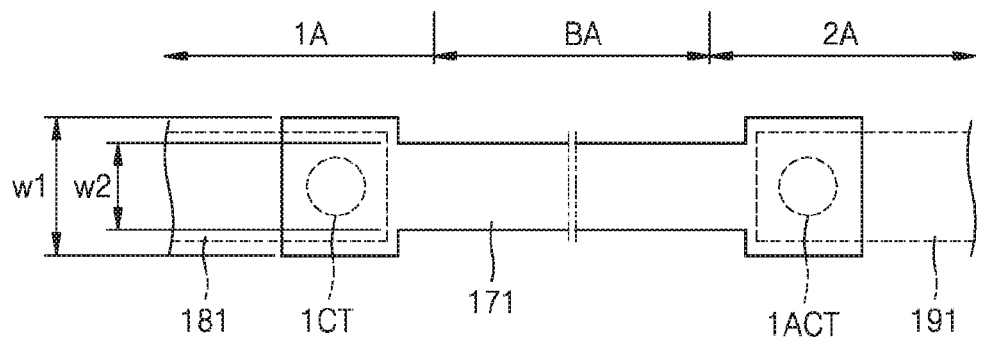
FIG. 7 is a schematic plan view of a part of a display apparatus according to an embodiment.

In addition, as shown in FIG. 7 that is a schematic plan view of a part of a display apparatus according to an embodiment, a portion of the first intermediate line 171, wherein the portion overlaps the first contact hole 1CT, may have a width W1 that is greater than a width W2 of the other portion of the first intermediate line 171. Here, the other portion of the first intermediate line 171 may not denote all the other portions than the portion overlapping the first contact hole 1CT. For example, in some cases, some portions of the first intermediate line 171 may have a width that is equal to or greater than the width W1 of the portion overlapping the first contact hole 1CT. This may be applied to embodiments that will be described later and modified examples thereof.

As described above, since the first contact hole 1CT may be formed by LAT, when the width W1 of the portion of the first intermediate line 171 overlapping the first contact hole 1CT is increased, irradiation of the laser beam onto the first substrate 101 under the first intermediate line 171 may be prevented and damage to the first substrate 101 may be prevented. Likewise, the width W1 of a portion of the first intermediate line 171, wherein the portion overlaps the first additional contact hole 1ACT, may be greater than the width W2 of any other portion of the first intermediate line 171.

Figure 8:
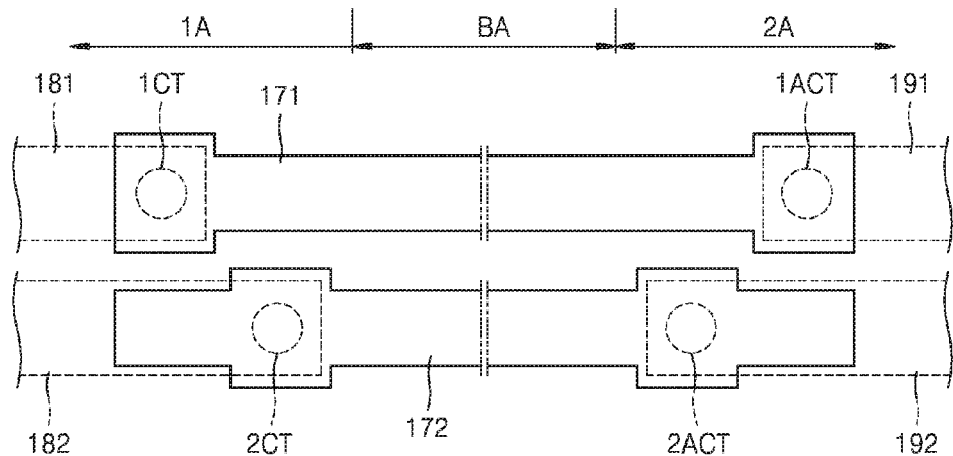
FIG. 8 is a schematic plan view of a part of a display apparatus according to an embodiment.

A case in which the display apparatus includes the first intermediate line 171, the first upper line 181, and the first additional line 191 is described above, but one or more embodiments are not limited thereto. For example, as shown in FIG. 8 that is a schematic plan view of a part of a display apparatus according to an embodiment, the display apparatus may further include a second intermediate line 172, a second upper line 182, and a second additional line 192.

The second intermediate line 172 is at least partially located in the bending area BA, like the first intermediate line 171, and disposed between the first substrate 101 and the second substrate 102. Here, the second intermediate line 172 extends in the same direction as the first intermediate line 171, and is spaced apart from the first intermediate line 171. The second upper line 182 is located on the second substrate 102 so as to be at least partially located in the first area 1A, like the first upper line 181, and is electrically connected to the second intermediate line 172 via a second contact hole 2CT in the second substrate 102. The second additional line 192 is located on the second substrate 102 so as to be at least partially located in the second area 2A, like the first additional line 191, and is electrically connected to the second intermediate line 172 via a second additional contact hole 2ACT in the second substrate 102. Through the above configuration, electric signals from an electronic device such as a printed circuit board or an integrated circuit that is electrically connected to the second additional line 192 may be transferred to the display device via the second intermediate line 172 and the second upper line 182.

The above descriptions about the first intermediate line 171, the first upper line 181, and the first additional line 191 may be applied to the second intermediate line 172, the second upper line 182, and the second additional line 192, respectively. For example, the second contact hole 2CT may be located within an upper surface of the second intermediate line 172, and an end of the second intermediate line 172 in a direction towards the display area DA may be closer to the display area DA than the second contact hole 2CT. The second additional contact hole 2ACT may be also located within the upper surface of the second intermediate line 172. In this case, an end of the second intermediate line 172 in a direction opposite the display area DA may be farther from the display area DA than the second additional contact hole 2ACT. In addition, the second intermediate line 172 may also include a plurality of through holes.

Moreover, a portion of the second intermediate line 172, wherein the portion overlaps the second contact hole 2CT, may have a width that is greater than that of the other portion of the second intermediate line 172. A portion of the second intermediate line 172, wherein the portion overlaps the second additional contact hole 2ACT, may also have a width that is greater than that of other portion of the second intermediate line 172. Here, the portion corresponding to the first contact hole 1CT in the first intermediate line 171 and the portion corresponding to the second contact hole 2CT in the second intermediate line 172 may not be adjacent to each other in a direction crossing the direction in which the first intermediate line 171 and the second intermediate line 172 extend. Likewise, the portion of the first intermediate line 171, wherein the portion overlaps the first additional contact hole 1ACT, and the portion of the second intermediate line 172, wherein the portion overlaps the second additional contact hole 2ACT, may not be adjacent to each other in a direction crossing the direction in which the first intermediate line 171 and the second intermediate line 172 extend. As such, even when the first intermediate line 171 has a partially thick portion and the second intermediate line 172 has a partially thick portion, generation of shorts due to contact between the thick portions may be prevented.

Figure 9:
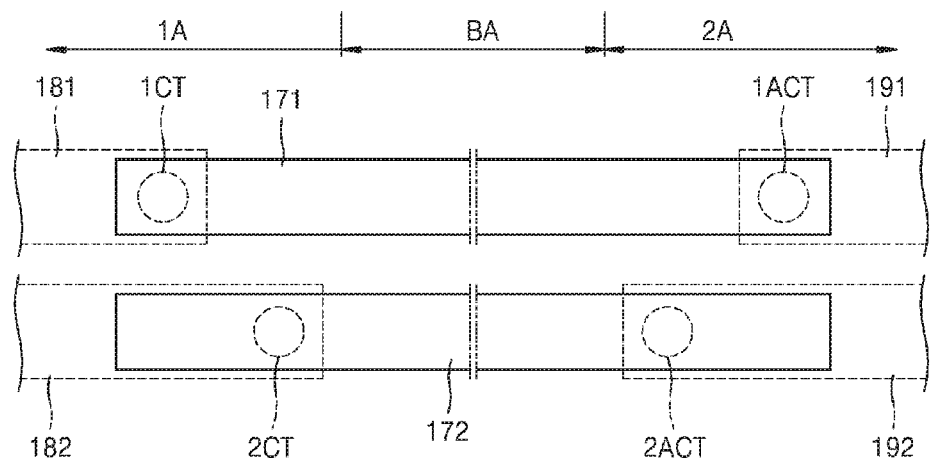
FIG. 9 is a schematic plan view of a part of a display apparatus according to an embodiment.

As shown in FIG. 9 that is a schematic plan view of a part of a display apparatus according to an embodiment, the first intermediate line 171 and the second intermediate line 172 may not have thick portions. Nevertheless, as shown in FIG. 9, the portion of the first intermediate line 171 corresponding to the first contact hole 1CT and the portion of the second intermediate line 172 corresponding to the second contact hole 2CT may not be adjacent to each other in a direction crossing the direction in which the first intermediate line 171 and the second intermediate line 172 extend. Likewise, the portion of the first intermediate line 171 corresponding to the first additional contact hole 1ACT and the portion of the second intermediate line 172 corresponding to the second additional contact hole 2ACT are not adjacent to each other in a direction crossing the direction in which the first intermediate line 171 and the second intermediate line 172 extend.

Figure 10:
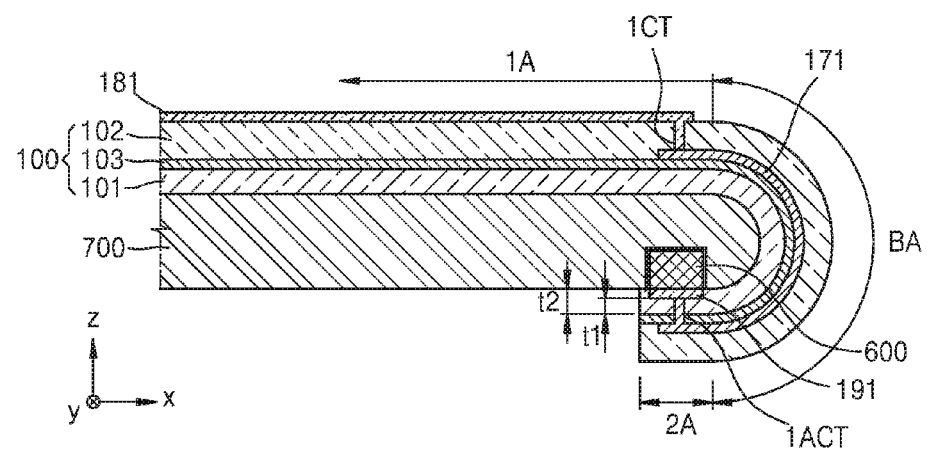
FIG. 10 is a schematic cross-sectional view of a part of a display apparatus according to an embodiment.

FIG. 10 is a schematic cross-sectional view of a part of a display apparatus according to an embodiment. The display apparatus according to the embodiment is different from the display apparatus according to the previous embodiment in view of a location of the first additional line 191.

The first additional line 191 in the display apparatus according to the embodiment is at least partially located in the second area 2A, and is located on the first substrate 101, not on the second substrate 102. In particular, the first additional line 191 is located on a surface of the first substrate 101, wherein the surface faces away from the second substrate 102. As shown in FIG. 10, since a recess is formed in the surface of the first substrate 101 and the first additional line 191 may be located in the recess, a bottom surface of the recess in the first substrate 101 may be also understood as a part of the surface of the first substrate 101, wherein the surface of the first substrate 101 faces away from the second substrate 102. The first additional line 191 is electrically connected to the first intermediate line 171 via the first additional contact hole 1ACT. Here, a material filling the first additional contact hole 1ACT may not be a material included in the first additional line 191, but may be a material included in the first intermediate line 171.

Figure 11:
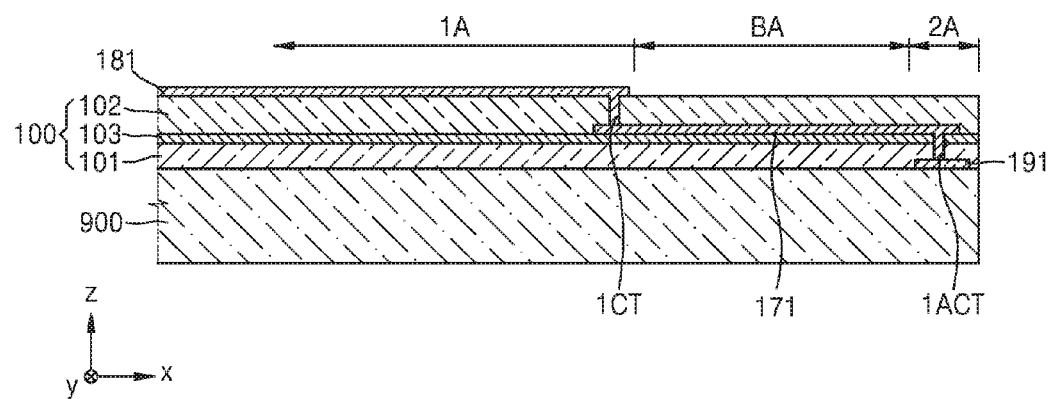
FIG. 11 is a schematic cross-sectional view illustrating a process of manufacturing the display apparatus of FIG. 10.

FIG. 11 is a cross-sectional view illustrating a process of manufacturing the display apparatus of FIG. 10. As shown in FIG. 11, the first additional line 191 is formed on a carrier substrate 900 by using a conductive material. The first additional line 191 may be formed by a deposition method using a mask, or may be formed by patterning a conductive layer by using photoresist, etc., after forming the conductive layer.

After that, the first substrate 101 is formed to cover the first additional line 191 by using a polymer resin, etc. Therefore, a portion of the first substrate 101 corresponding to the first additional line 191 may have a thickness t1 (see FIG. 10) that is less than a thickness t2 (see FIG. 10) of other portions of the first substrate 101. In addition, in the surface of the first substrate 101 away from the second substrate 102, a portion adjacent to the first additional line 191 may configure a continuous surface with a surface of the first additional line 191 away from the second substrate 102. In the surface of the first substrate 101 away from the second substrate 102, the portion adjacent to the first additional line 191 contacts an upper surface of the carrier substrate 900 (in a +z direction), and the surface of the first additional line 191 away from the second substrate 102 also contacts the upper surface of the carrier substrate 900 (in the +z direction).

After forming the first substrate 101, the first additional contact hole 1ACT exposing at least a part of the first additional line 191 is formed in the first substrate 101. Before forming the first additional contact hole 1ACT, the barrier layer 103 may be formed on the first substrate 101, in some cases. In this case, the first additional contact hole 1ACT exposing at least a part of the first additional line 191 may be formed in the barrier layer 103 and the first substrate 101. The first additional contact hole 1ACT may be formed by various methods; for example, an etching method using photoresist may be used, or a laser beam is irradiated into a surface of the first substrate 101 away from the carrier substrate 900 so as to remove a portion of the first substrate 101.

After that, the first intermediate line 171 is formed on the first substrate 101 or the barrier layer 103. The first intermediate line 171 may be formed by a deposition method using a mask, or may be formed by patterning a conductive layer by using a photoresist after forming the conductive layer. Here, a material for forming the first intermediate line 171 fills the first additional contact hole 1ACT so that the first intermediate line 171 may be electrically connected to the first additional line 191.

After forming the first intermediate line 171, the second substrate 102 is formed, and then the first contact hole 1CT is formed in the second substrate 102 and the first upper line 181 is formed. Then, a material for forming the first upper line 181 may fill the first contact hole 1CT so that the first upper line 181 may be electrically connected to the first intermediate line 171. Before forming the first contact hole 1CT in the second substrate 102, the buffer layer 110, the gate insulating layer 120, and the interlayer insulating layer 130 may be formed in some cases, as illustrated above with reference to FIG. 3. Then, the first contact hole 1CT may be formed in the second substrate 102.

After that, a display device is disposed over the substrate 100, and the substrate 100 is separated from the carrier substrate 900. Then, the substrate 100 is bent at the bending area BA so as to manufacture the display apparatus as shown in FIG. 10.

In the above description, the barrier layer 103 is formed on the first substrate 101, the first intermediate line 171 is formed on the barrier layer 103, and then, the second substrate 102 is formed. However, one or more embodiments are not limited thereto. For example, the first intermediate line 171 may be formed on the first substrate 101, and the barrier layer 103 may be formed over the entire surface of the first substrate 101 so as to cover the first intermediate line 171. After that, the second substrate 102 may be formed on the barrier layer 103. In this case, the first contact hole 1CT and/or the first additional contact hole 1ACT may be formed penetrating throughout the barrier layer 103, as well as the second substrate 102. When the first intermediate line 171 and the second substrate 102 directly contact each other, an adhesive force therebetween may be weak, and accordingly, the barrier layer 103 may be disposed between the first intermediate line 171 and the second substrate 102 so as to prevent the adhesive force from weakening. The barrier layer 103 may be variously modified; for example, it may be located both above and below the first intermediate line 171. This may be applied to embodiments that will be described later or modified examples thereof. In some cases, the first additional line 191 may be formed on the carrier substrate 900, and the barrier layer 103 may be formed to cover the first additional line 191. In this case, forming of the first substrate 101 may be performed thereafter. This may be applied to embodiments that will be described later or modified examples thereof.

In addition, as shown in FIG. 10, the display apparatus according to the embodiment may further include an electronic device 600. The electronic device 600 may be an electronic chip such as an integrated circuit. The electronic device 600 may be located on a surface of the first additional line 191, wherein the surface is away from the second substrate 102. As such, electric signals from the electronic device 600 may be transferred to the display device or the thin film transistor via the first additional line 191, the first intermediate line 171, and the first upper line 181. In addition, in the display apparatus according to the embodiment, since the electronic device 600 is located inside the substrate 100, the electronic device 600 may be effectively protected against external shock. That is, the substrate 100 is bent so that at least a part of the first substrate 101 in the first area 1A and at least a part of the first substrate 101 in the second area 2A may face each other, and the electronic device 600 is between the facing parts of the first substrate 101 so as to be effectively protected against external shock.

Moreover, as shown in FIG. 10, the display apparatus according to the embodiment may further include a support layer 700 disposed between the facing parts of the first substrate 101, wherein the support layer 700 has a concave portion for accommodating the electronic device 600. In this case, the support layer 700 may support the substrate 100, and at the same time, may protect the electronic device 600. In addition, in some cases, the support layer 700 may have elasticity so as to absorb external shock.

In a case in which the first additional line 191 is located on the first substrate 101, not on the second substrate 102, the above description with reference to FIG. 6 may be applied. For example, the first contact hole 1CT may be located within an upper surface of the first intermediate line 171, and an end of the first intermediate line 171 in the direction towards the display area DA may be closer to the display area DA than the first contact hole 1CT. The first additional contact hole 1ACT may be located within the upper surface of the first additional line 191 because the first additional contact hole 1ACT is formed after forming the first additional line 191. In this case, an end of the first additional line 191 in the direction towards the display area DA may be closer to the display area DA than the first additional contact hole 1ACT. As such, positioning of the first additional contact hole 1ACT within the upper surface of the first additional line 191 may be ensured.

Figure 12:
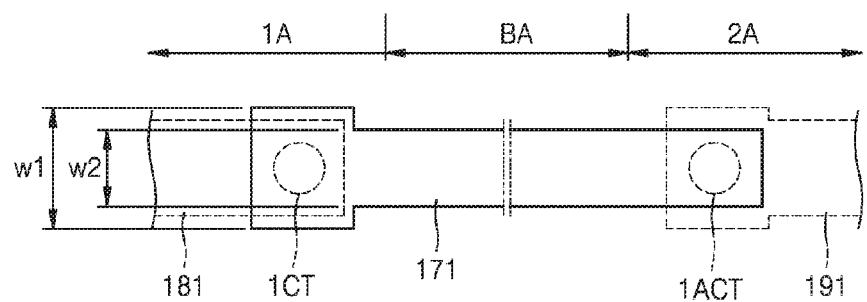
FIG. 12 is a schematic plan view of a part of a display apparatus according to an embodiment.

In addition, as shown in FIG. 12 that is a schematic plan view of a part of a display apparatus according to an embodiment, a portion of the first intermediate line 171 corresponding to the first contact hole 1CT may have a width that is greater than that of the other portion of the first intermediate line 171, as described above with reference to FIG. 7. However, unlike the example shown in FIG. 7, a portion of the first additional line 191 corresponding to the first additional contact hole 1ACT may have a width that is greater than that of other portion of the first additional line 191, as shown in FIG. 12, because the first additional contact hole 1ACT is formed after forming the first additional line 191.

Figure 13:
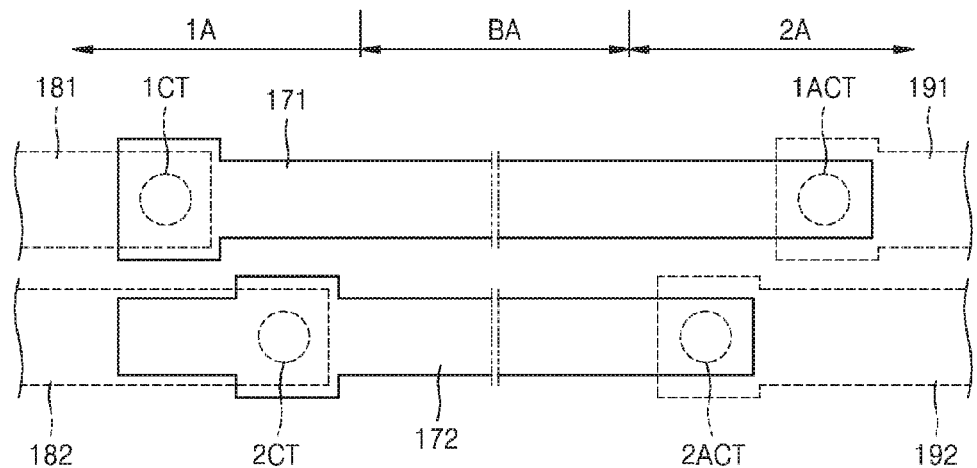
FIG. 13 is a schematic plan view of a part of a display apparatus according to an embodiment.

In addition, as shown in FIG. 13 that is a schematic plan view of a part of a display apparatus according to an embodiment, the display apparatus may further include the second intermediate line 172, the second upper line 182, and the second additional line 192. The second intermediate line 172 is at least partially located in the bending area BA, like the first intermediate line 171, and disposed between the first substrate 101 and the second substrate 102. Here, the second intermediate line 172 extends in the same direction as that of the first intermediate line 171, and is spaced apart from the first intermediate line 171. The second upper line 182 is at least partially located in the first area 1A, like the first upper line 181, and is electrically connected to the second intermediate line 172 via the second contact hole 2CT in the second substrate 102. The second additional line 192 is located on the surface of the first substrate 101, wherein the surface is away from the second substrate 102, so as to be at least partially located in the second area 2A, like the first additional line 191, and is electrically connected to the second intermediate line 172 via the second additional contact hole 2ACT in the first substrate 101. Through the above configuration, electric signals from the electronic device such as a printed circuit board or an integrated circuit electrically connected to the second additional line 192 may be transferred to the display device via the second intermediate line 172 and the second upper line 182.

The above descriptions about the first intermediate line 171, the first upper line 181, and the first additional line 191 may be applied to the second intermediate line 172, the second upper line 182, and the second additional line 192, respectively. For example, the second contact hole 2CT may be located within an upper surface of the second intermediate line 172, and an end of the second intermediate line 172 in the direction towards the display area DA may be closer to the display area DA than the second contact hole 2CT. The second additional contact hole 2ACT may be also located within the upper surface of the second additional line 192. In addition, in this case, an end of the second additional line 192 in the direction towards the display area DA may be closer to the display area DA than the second additional contact hole 2ACT.

Moreover, as shown in FIG. 13, in the second intermediate line 172, a width of a portion corresponding to the second contact hole 2CT may be greater than that of the other portion of the second intermediate line 172, as described above with reference to FIG. 8. However, since the second additional line 192 is formed before forming the second additional contact hole 2ACT, unlike the example of FIG. 8, a portion of the second additional line 192 corresponding to the second additional contact hole 2ACT may have a greater width than the other portion of the second additional line 192, as shown in FIG. 13.

Here, the portion of the first intermediate line 171 corresponding to the first contact hole 1CT and the portion of the second intermediate line 172 corresponding to the second contact hole 2CT may not be adjacent to each other in a direction crossing the direction in which the first intermediate line 171 and the second intermediate line 172 extend. Likewise, the portion of the first additional line 191 corresponding to the first additional contact hole 1ACT and the portion of the second additional line 192 corresponding to the second additional contact hole 2ACT may not be adjacent to each other in a direction crossing the direction in which the first additional line 191 and the second additional line 192 extend. As such, even when the first intermediate line 171, the second intermediate line 172, the first additional line 191, and the second additional line 192 have partially thick portions, generation of shorts due to contact between the thick portions may be prevented.

The plan view of FIG. 9 may be applied to the display apparatus illustrated with reference to FIG. 10. That is, unlike the example illustrated in FIG. 13, the first intermediate line 171, the second intermediate line 172, the first additional line 191, and the second additional line 192 may not have partially thick portions as shown in FIG. 9. Nevertheless, the portion of the first intermediate line 171 corresponding to the first contact hole 1CT and the portion of the second intermediate line 172 corresponding to the second contact hole 2CT may not be adjacent to each other in a direction crossing the direction in which the first intermediate line 171 and the second intermediate line 172 extend. Likewise, the portion of the first additional line 191 corresponding to the first additional contact hole 1ACT and the portion of the second additional line 192 corresponding to the second additional contact hole 2ACT may not be adjacent to each other in a direction crossing the direction in which the first additional line 191 and the second additional line 192 extend.

Figure 14:
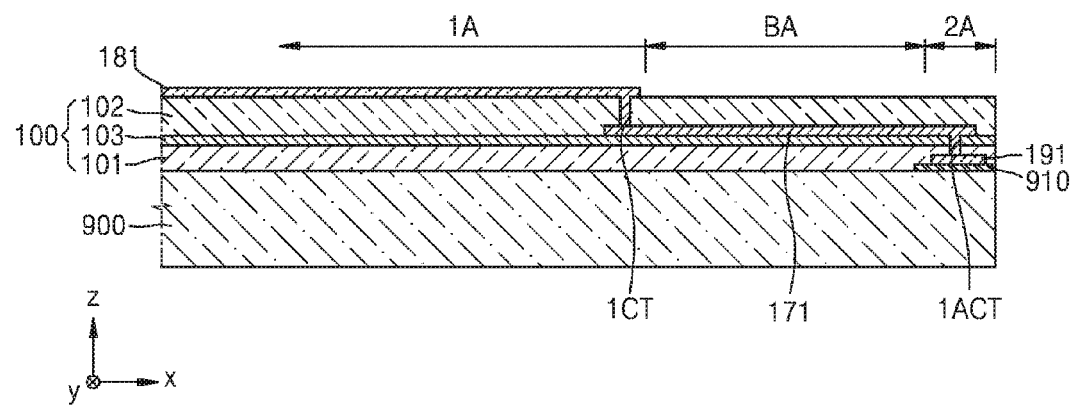
FIG. 14 is a schematic cross-sectional view illustrating a process of manufacturing a display apparatus according to an embodiment.

In addition, as shown in FIG. 11, when the first additional line 191 is formed on the carrier substrate 900, the first additional line 191 may not be easily separated from the carrier substrate 900 when the substrate 100 is separated from the carrier substrate 900 in a later process. To address this, as shown in FIG. 14 that is a schematic cross-sectional view illustrating a process of manufacturing a display apparatus according to an embodiment, a bond weakening layer 910 may be formed on a portion of the carrier substrate 900 on which the first additional line 191 is to be formed before forming the first additional line 191. When the first additional line 191 including metal is formed on the bond weakening layer 910, a bonding force between the first additional line 191 and the bond weakening layer 910 is low, and thus, the first additional line 191 may be easily separated from the bond weakening layer 910 when the substrate 100 is separated from the carrier substrate 900. The bond weakening layer 910 may include, e.g., graphene.

Figure 15:
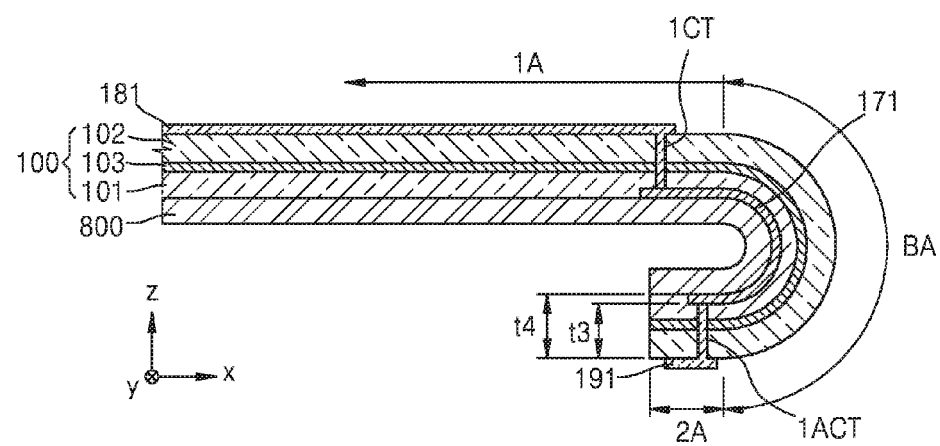
FIG. 15 is a schematic cross-sectional view of a part of a display apparatus according to an embodiment.

FIG. 15 is a schematic cross-sectional view of a part of a display apparatus according to an embodiment. The display apparatus according to the embodiment is different from the display apparatus according to the previous embodiments in view of a location of the first intermediate line 171 and the existence of a lower protective film 800.

As shown in FIG. 15, in the display apparatus according to the embodiment, the first intermediate line 171 is at least partially located in the bending area BA, and is disposed on a lower surface of the substrate 100, wherein the lower surface of the substrate 100 is an internal surface in the bending area BA. In addition, the first upper line 181 is located on an upper surface of the substrate 100 so that at least a part of the first upper line 181 is located in the first area 1A, and is electrically connected to the first intermediate line 171 on the lower surface of the substrate 100, via the first contact hole 1CT in the substrate 100. In addition, the lower surface of the substrate 100 and the first intermediate line 171 are covered by the lower protective film 800.

The lower protective film 800 includes a protective film base including PET or PI, and an adhesive layer including a pressure sensitive adhesive (PSA). In addition, the lower protective film 800 is attached to the lower surface of the substrate 100 by the adhesive layer. In general, the first substrate 101 and the second substrate 102 may each have a thickness of about tens of micrometers, and the lower protective film 800 has a thickness of about 100 µm. Thus, the lower protective film 800 is thicker than the substrate 100. However, since the adhesive layer in the lower protective film 800 has PSA, the adhesive layer may relieve stress generated when the substrate 100 is bent. Therefore, in a stack structure including the lower protective film 800 and the substrate 100, a neutral plane in the stack structure in the bending area BA is formed around the adhesive layer of the lower protective film 800. As described above, the first intermediate line 171 is between a lower surface of the substrate 100 and the lower protective film 800, and thus, the neutral plane may be located at the first intermediate line 171 or around the first intermediate line 171, and accordingly, damage to the first intermediate line 171 may be prevented when the stack structure is bent.

As shown in FIG. 15, the display apparatus according to the embodiment may include the first additional line 191 that is at least partially located in the second area 2A and is located on an upper surface of the substrate 100 to be electrically connected to the first intermediate line 171 via the first additional contact hole 1ACT in the substrate 100. The first additional line 191 may be formed simultaneously with the first upper line 181. The first additional line 191 and the first upper line 181 may be simultaneously formed when components such as a thin film transistor is formed in the display area. An electronic device such as a printed circuit board or an integrated circuit may be electrically connected to the first additional line 191.

As shown in FIG. 15, the first contact hole 1CT may be located within an upper surface of the first intermediate line 171. As described above, the first contact hole 1CT may be formed by LAT, and thus, when the first contact hole 1CT is formed within the upper surface of the first intermediate line 171, irradiation of a laser beam onto the carrier substrate 900 under the first intermediate line 171 may be prevented, and damage to the carrier substrate 900 may be prevented. This is because the first intermediate line 171 including metal may block the laser beam. In the display apparatus according to the embodiment, the first area 1A includes the display area DA, and an end of the first intermediate line 171 in the direction towards the display area DA may be closer to the display area DA than the first contact hole 1CT. Accordingly, the first contact hole 1CT may be located within the upper surface of the first intermediate line 171. Likewise, the first additional contact hole 1ACT may also be located within the upper surface of the first intermediate line 171. In this case, an end of the first intermediate line 171 in a direction opposite the display area DA may be farther from the display area DA than the first additional contact hole 1ACT. Accordingly, the first additional contact hole 1ACT may be located within the upper surface of the first intermediate line 171.

As described above with reference to FIG. 6, the first intermediate line 171 may include a plurality of through holes 171a. As such, the strength of the first intermediate line 171 may be decreased, and the first intermediate line 171 may be smoothly bent. The plurality of through holes 171a may be only located in the bending area BA.

The above description with reference to FIGS. 7 to 9 may be applied to the embodiment illustrated with reference to FIG. 15. That is, as shown in FIG. 7, a portion of the first intermediate line 171 corresponding to the first contact hole 1CT may have a width W1 that is greater than a width W2 of the other portion of the first intermediate line 171. As such, irradiation of a laser beam onto the carrier substrate 900 under the first intermediate line 171 may be blocked to prevent damage to the carrier substrate 900. Likewise, a portion of the first intermediate line 171 corresponding to the first additional contact hole 1ACT may have the width W1 that is greater than that W2 of the other portion of the first intermediate line 171.

As shown in FIG. 8, the display apparatus according to the embodiment may further include the second intermediate line 172, the second upper line 182, and the second additional line 192.

The second intermediate line 172 is at least partially located in the bending area BA, like the first intermediate line 171, and is located on a lower surface of the substrate 100. Here, the second intermediate line 172 extends in the same direction as the first intermediate line 171, and is spaced apart from the first intermediate line 171. The second upper line 182 is located on the substrate 100 so as to be at least partially located in the first area 1A, and is electrically connected to the second intermediate line 172 via the second contact hole 2CT in the substrate 100. The second additional line 192 is located on the substrate 100 so as to be at least partially located in the second area 2A, like the first additional line 191, and is electrically connected to the second intermediate line 172 via the second additional contact hole 2ACT in the substrate 100. As such, electric signals from an electronic device such as a printed circuit board or an integrated circuit that is electrically connected to the second additional line 192 may be transferred to the display device via the second intermediate line 172 and the second upper line 182.

The above descriptions about the first intermediate line 171, the first upper line 181, and the first additional line 191 may be applied to the second intermediate line 172, the second upper line 182, and the second additional line 192, respectively. For example, the second contact hole 2CT may be located within the upper surface of the second intermediate line 172, and an end of the second intermediate line 172 in a direction towards the display area DA may be closer to the display area DA than the second contact hole 2CT. The second additional contact hole 2ACT may be also located within the upper surface of the second intermediate line 172. In this case, an end of the second intermediate line 172 in a direction opposite the display area DA may be farther from the display area DA than the second additional contact hole 2ACT. In addition, the second intermediate line 172 may also include a plurality of through holes.

Moreover, in the second intermediate line 172, a portion corresponding to the second contact hole 2CT may have a width that is greater than that of other portion of the second intermediate line 172. Also, in the second intermediate line 172, a portion corresponding to the second additional contact hole 2ACT may have a width that is greater than that of other portion of the second intermediate line 172. Here, the portion of the first intermediate line 171 corresponding to the first contact hole 1CT and the portion of the second intermediate line 172 corresponding to the second contact hole 2CT may not be adjacent to each other in a direction crossing the direction in which the first intermediate line 171 and the second intermediate line 172 extend. Likewise, the portion of the first intermediate line 171 corresponding to the first additional contact hole 1ACT and the portion of the second intermediate line 172 corresponding to the second additional contact hole 2ACT may not be adjacent to each other in a direction crossing the direction in which the first intermediate line 171 and the second intermediate line 172 extend. As such, even if the first intermediate line 171 has a partially thick portion and the second intermediate line 172 has a partially thick portion, generation of shorts due to contact between the thick portions may be prevented.

In some cases, as shown in FIG. 9, the first intermediate line 171 and the second intermediate line 172 may not have thick portions. Also, as shown in FIG. 9, the portion of the first intermediate line 171 corresponding to the first contact hole 1CT and the portion of the second intermediate line 172 corresponding to the second contact hole 2CT may not be adjacent to each other in a direction crossing the direction in which the first intermediate line 171 and the second intermediate line 172 extend. Likewise, the portion of the first intermediate line 171 corresponding to the first additional contact hole 1ACT and the portion of the second intermediate line 172 corresponding to the second additional contact hole 2ACT may not be adjacent to each other in a direction crossing the direction in which the first intermediate line 171 and the second intermediate line 172 extend.

Figure 16:
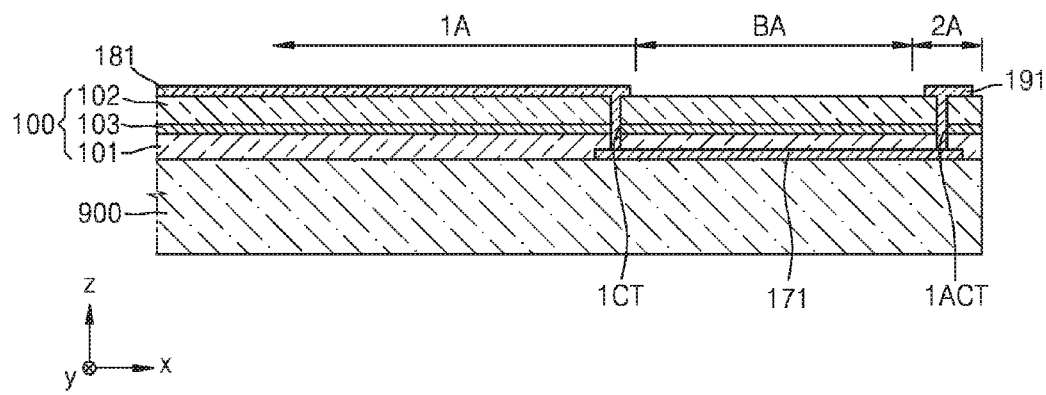
FIG. 16 is a schematic cross-sectional view illustrating a process of manufacturing the display apparatus of FIG. 15.

FIG. 16 is a schematic cross-sectional view illustrating a process of manufacturing the display apparatus of FIG. 15. As shown in FIG. 16, the first intermediate line 171 including a conductive material is formed on the carrier substrate 900. The first intermediate line 171 may be formed by a deposition method using a mask, or may be formed by forming a conductive layer and patterning the conductive layer by using a photoresist.

After that, the first substrate 101 including a polymer resin is formed to cover the first intermediate line 171. Therefore, a thickness t3 (see FIG. 15) of the first substrate 101 at a portion corresponding to the first intermediate line 171 may be less than a thickness t4 (see FIG. 15) of other portion of the first substrate 101. In addition, in a surface of the first substrate 101 away from the second substrate 102, that is, a lower surface of the substrate 100, a portion adjacent to the first intermediate line 171 may form a continuous or flush surface with a surface of the first intermediate line 171 away from the second substrate 102. In the surface of the first substrate 101 away from the second substrate 102, the portion adjacent to the first intermediate line 171 contacts an upper surface of the carrier substrate 900 (in the +z direction), and the surface of the first intermediate line 171 away from the second substrate 102 also contacts the upper surface of the carrier substrate 900 (in the +z direction).

After forming the first substrate 101, the second substrate 102 is formed. In some cases, the barrier layer 103 may be formed between the first and second substrates 101 and 102. In addition, the first contact hole 1CT is formed in the substrate 100 so as to partially expose the first intermediate line 171, and then, the first upper line 181 is formed so that a material of the first upper line 181 fills the first contact hole 1CT, and the first upper line 181 is electrically connected to the first intermediate line 171. As described above with reference to FIG. 3, the buffer layer 110, the gate insulating layer 120, and the interlayer insulating layer 130 may be formed in some cases, before forming the first contact hole 1CT in the substrate 100. After that, the first contact hole 1CT may be formed in the substrate 100. The first contact hole 1CT may be formed by, for example, using LAT.

After that, the display device is formed on the substrate 100, the substrate 100 is separated from the carrier substrate 900, the lower protective film 800 is attached to the lower surfaces of the first intermediate line 171 and the substrate 100, and the substrate 100 and the lower protective film 800 are bent at the bending area BA to obtain the display apparatus as illustrated in FIG. 15.

Figure 17:
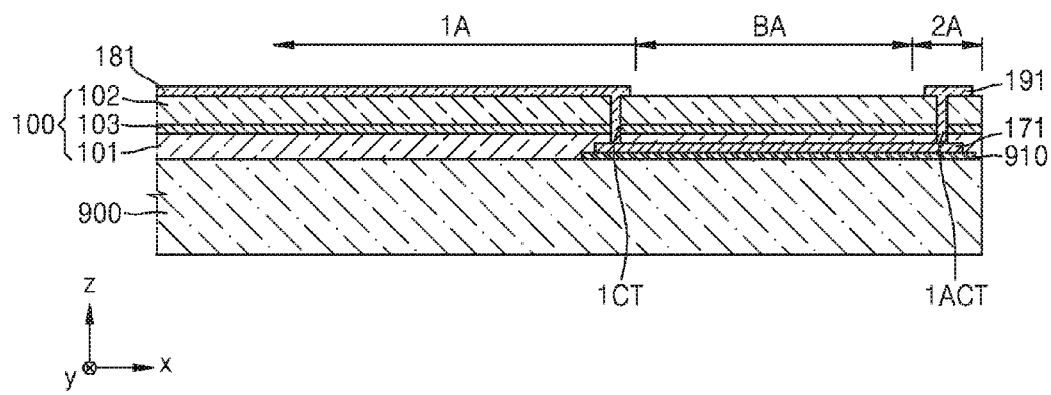
FIG. 17 is a schematic cross-sectional view illustrating a process of manufacturing a display apparatus according to an embodiment.

In addition, as shown in FIG. 16, when the first intermediate line 171 is formed on the carrier substrate 900, the first intermediate line 171 may not be easily detached from the carrier substrate 900 when detaching the substrate 100 from the carrier substrate 900. To prevent this, as shown in FIG. 17 that is a schematic cross-sectional view illustrating a process of manufacturing a display apparatus according to an embodiment, a bond weakening layer 910 may be formed in advance on a portion of the carrier substrate 900 on which the first intermediate line 171 is to be formed. When the first intermediate line 171 including a metal material is formed on the bond weakening layer 910, a coupling force between the first intermediate line 171 and the bond weakening layer 910 is weak, and thus, the first intermediate line 171 may be easily detached from the bond weakening layer 910 when separating the substrate 100 from the carrier substrate 900. The bond weakening layer 910 may include, for example, graphene.

Figure 18:
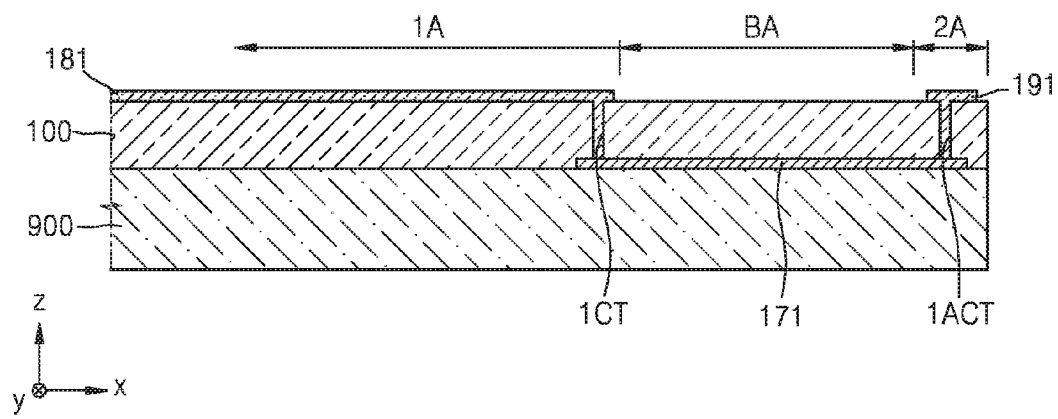
FIG. 18 is a schematic cross-sectional view of a part of a display apparatus according to an embodiment.

In addition, although the substrate 100 is shown to include the first substrate 101, the second substrate 102, and the barrier layer 103 in FIG. 16, the description with reference to FIG. 16 may be applied to the substrate 100 having a single layer as shown in FIG. 18.

Figure 19:
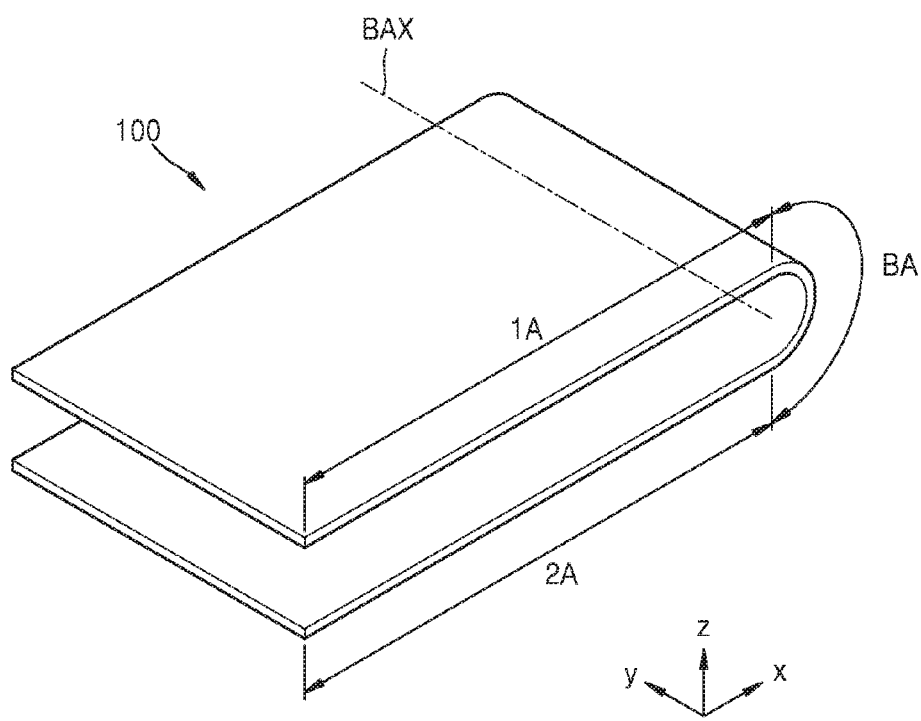
FIG. 19 is a schematic perspective view of a part of a display apparatus according to an embodiment.

In addition, as shown in FIG. 19 that is a schematic perspective view of a part of a display apparatus according to an embodiment, the bending area BA may not be outside the display area. That is, as shown in FIG. 19, the second area 2A may have an area that is equal to or nearly equal to that of the first area 1A, and in this case, the display area is located throughout the first area 1A, the bending area BA, and the second area 2A.

Figure 20:
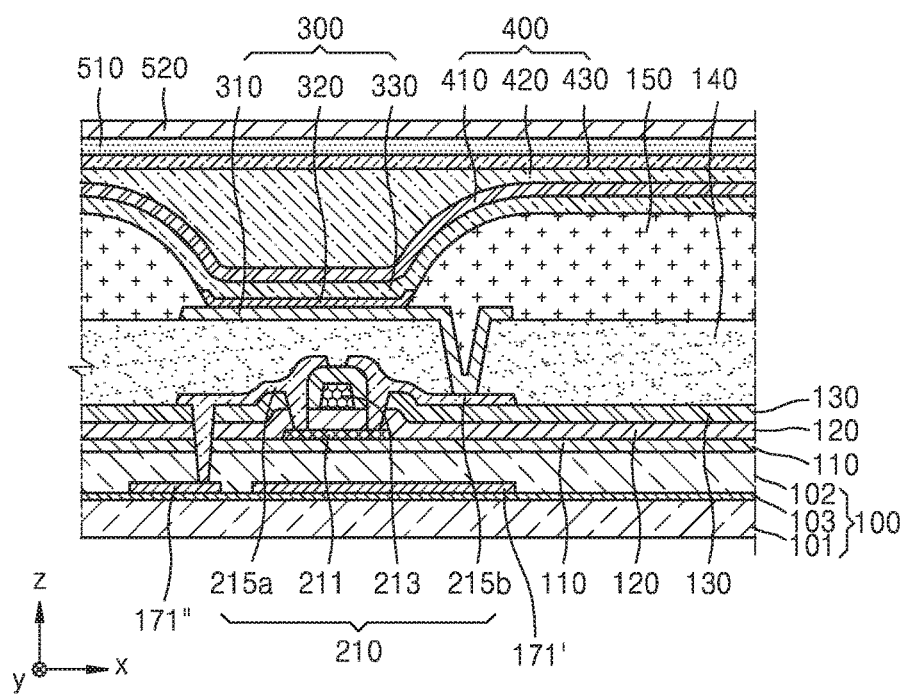
FIG. 20 is a schematic cross-sectional view of a part of the display apparatus of FIG. 19.

In this case, lines located in (sub)pixels in the bending area BA may have same structures as those of the first intermediate line 171 or the additional intermediate line 171'. That is, as shown in FIG. 20 that is a schematic cross-sectional view of a part of the bending area BA in the display apparatus of FIG. 19, a data line may be implemented by using an additional intermediate line 171" to prevent the data line from being damaged in the bending area BA. In FIG. 20, a (sub) pixel located in the bending area BA is schematically shown. In addition, FIG. 20 illustrates that the additional intermediate line 171" located between the first substrate 101 and the second substrate 102 is electrically connected to the source electrode 215a of the thin film transistor 210 to act as a data line.

In addition, in the display area located in the first area 1A or the second area 2A, rather than the bending area BA, the data line may be located at the same layer level as that of the source electrode 215a similarly to the example illustrated in FIG. 3. The data line of a non-bending area may be electrically connected to the additional intermediate line 171" performing as the data line in the bending area BA, via the contact hole similarly to the structures illustrated in FIGS. 6 to 9, 12, and 13. In some cases, the additional intermediate line located between the first substrate 101 and the second substrate 102 may perform as the data line in the non-bending area.

As described above, the additional intermediate line 171" is used as the data line in the display area located in the bending area BA, and at the same time, as shown in FIG. 20, the additional intermediate line 171' between the first substrate 101 and the second substrate 102 is located to correspond to the thin film transistor 210 so as to perform as a shielding layer that prevents external light from passing through the substrate 100 and reaching the thin film transistor 210. In some cases, the additional intermediate line 171' may act as an electrode of a capacitor or another line. The additional intermediate line 171" and/or the additional intermediate line 171' may be formed simultaneously with the first additional line 171 by using the same material as that of the first additional line 171.

The display apparatus is described above, but a manufacturing method thereof also belongs to the scope of the present disclosure.

According to one or more embodiments, a display apparatus capable of reducing defects such as a disconnection during manufacturing processes while ensuring longer lifespan of the display apparatus may be implemented. The scope of the present disclosure is not limited to the above effects.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
    a substrate comprising a bending area between a first area and a second area to be bent in the bending area about a bending axis, the substrate comprising a first substrate and a second substrate that are stacked;
    a first intermediate line at least partially located in the bending area, and located between the first substrate and the second substrate;
    a first upper line located in the first area and comprising an end portion facing the second area, the first upper line over the second substrate to be electrically connected to the first intermediate line via a first contact hole in the second substrate, the first contact hole being located in the first area; and
    a first additional line at least partially located in the second area and comprising an end portion facing the first area, the first additional line over the second substrate to be electrically connected to the first intermediate line via a first additional contact hole in the second substrate, the first additional contact hole being located in the second area.

2. The display apparatus of claim 1, wherein the first upper line is at least partially located in the first area.

3. The display apparatus of claim 1, further comprising:
    a second intermediate line at least partially located in the bending area, and located between the first substrate and the second substrate; and a second upper line over the second substrate to be electrically connected to the second intermediate line via a second contact hole in the second substrate.

4. The display apparatus of claim 1, wherein a portion of the first intermediate line, which corresponds to the first additional contact hole, has a width that is greater than a width of the other portion of the first intermediate line.

5. The display apparatus of claim 1, further comprising:
a second intermediate line at least partially located in the bending area, and located between the first substrate and the second substrate; and
a second additional line over the second substrate to be electrically connected to the second intermediate line via a second additional contact hole in the second substrate.

6. The display apparatus of claim 5, wherein, in the first intermediate line, a portion overlapping the first additional contact hole has a width that is greater than a width of the other portion of the first intermediate line, and in the second intermediate line, a portion overlapping the second additional contact hole has a width that is greater than a width of the other portion of the second intermediate line, and
wherein the portion of the first intermediate line overlapping the first additional contact hole and the portion of the second intermediate line overlapping the second additional contact hole are not adjacent to each other in a direction crossing a direction in which the first intermediate line and the second intermediate line extend.

7. The display apparatus of claim 5, wherein the portion of the first intermediate line overlapping the first additional contact hole and the portion of the second intermediate line overlapping the second additional contact hole are not adjacent to each other in a direction crossing a direction in which the first intermediate line and the second intermediate line extend.

8. The display apparatus of claim 1, wherein the first area comprises a display area, and an end portion of the first intermediate line in a direction towards the display area is closer to the display area than the first contact hole.

9. The display apparatus of claim 1, wherein a portion of the first intermediate line overlapping the first contact hole has a width that is greater than a width of the other portion of the first intermediate line.

10. The display apparatus of claim 1, wherein the first area comprises a display area, and the first upper line is electrically connected to a display device located in the display area.

11. The display apparatus of claim 1, wherein the first area comprises a display area, and the display area is throughout the first area, the bending area, and the second area.

12. A display apparatus comprising:
a substrate comprising a bending area between a first area and a second area to be bent in the bending area about a bending axis, the substrate comprising a first substrate and a second substrate that are stacked;
a first intermediate line at least partially located in the bending area, and located between the first substrate and the second substrate;
a first upper line over the second substrate to be electrically connected to the first intermediate line via a first contact hole in the second substrate;
a second intermediate line at least partially located in the bending area, and located between the first substrate and the second substrate; and
a second upper line over the second substrate to be electrically connected to the second intermediate line via a second contact hole in the second substrate,
wherein the portion of the first intermediate line overlapping the first contact hole and the portion of the second intermediate line overlapping the second contact hole are not adjacent to each other in a lateral direction, the lateral direction being parallel to the substrate and crossing a direction in which the first intermediate line and the second intermediate line extend.

13. The display apparatus of claim 12, wherein, when viewed in a direction perpendicular to the substrate, in the first intermediate line, a portion overlapping the first contact hole has a width that is greater than a width of the other portion of the first intermediate line, and in the second intermediate line, a portion overlapping the second contact hole has a width that is greater than a width of the other portion of the second intermediate line.

14. A display apparatus comprising:
a substrate comprising a bending area between a first area and a second area to be bent in the bending area about a bending axis, the substrate comprising a first substrate and a second substrate that are stacked;
a first intermediate line at least partially located in the bending area, and located between the first substrate and the second substrate;
a first upper line over the second substrate to be electrically connected to the first intermediate line via a first contact hole in the second substrate; and
a first additional line at least partially located in the second area, the first additional line over the first substrate being electrically connected to the first intermediate line via a first additional contact hole in the first substrate.

15. The display apparatus of claim 14, wherein the first additional contact hole is located to correspond to an upper surface of the first additional line and within the upper surface of the first additional line.

16. The display apparatus of claim 14, wherein the portion of the first additional line overlaps the first additional contact hole and has a width that is greater than a width of the other portion of the first additional line.

17. The display apparatus of claim 14, further comprising:
a second intermediate line at least partially located in the bending area, and located between the first substrate and the second substrate; and
a second additional line over the first substrate to be electrically connected to the second intermediate line via a second additional contact hole in the first substrate.

18. The display apparatus of claim 17, wherein, in the first additional line, a portion overlapping the first additional contact hole has a width that is greater than a width of the other portion of the first additional line, and in the second additional line, a portion overlapping the second additional contact hole has a width that is greater than a width of the other portion of the second additional line, and
wherein the portion of the first additional line overlapping the first additional contact hole and the portion of the second additional line overlapping the second additional contact hole are not adjacent to each other in a direction crossing a direction in which the first additional line and the second additional line extend.

19. The display apparatus of claim 17, wherein the portion of the first additional line overlapping the first additional contact hole and the portion of the second additional line overlapping the second additional contact hole are not adjacent to each other in a direction crossing a direction in which the first additional line and the second additional line extend.

20. The display apparatus of claim 14, further comprising an electronic device over a surface of the first additional line, the surface of the first additional line being away from the second substrate.

21. The display apparatus of claim 20, wherein the substrate is bent such that a part of the first substrate in the first area and at least a part of the first substrate in the second area face each other, and the display apparatus further comprises a support layer between the parts of the first substrate facing each other and comprising a concave portion for accommodating the electronic device.

22. A display apparatus comprising:
a substrate comprising a bending area between a first area and a second area to be bent in the bending area about a bending axis, the substrate comprising a first substrate and a second substrate that are stacked, wherein a display area is throughout the first area, the bending area, and the second area;
a first intermediate line at least partially located in the bending area, and located between the first substrate and the second substrate;
a first upper line over the second substrate to be electrically connected to the first intermediate line via a first contact hole in the second substrate; and
a data line and a scan line that cross each other in the display area, wherein one of the data line and the scan line is the first upper line, and the first upper line is connected to the first intermediate line in a region where the data line and the scan line cross each other such that the data line and the scan line do not directly contact each other.

23. A display apparatus comprising:
a substrate comprising a bending area between a first area and a second area to be bent in the bending area about a bending axis, the substrate comprising a first substrate and a second substrate that are stacked;
a first intermediate line at least partially located in the bending area, and located between the first substrate and the second substrate;
a first upper line over the second substrate to be electrically connected to the first intermediate line via a first contact hole in the second substrate;
a thin film transistor over the second substrate to be located in at least one of the first area, the bending area, and the second area; and
a shielding layer located between the first substrate and the second substrate to correspond to the thin film transistor to prevent external light from reaching the thin film transistor,
wherein the shielding layer includes a same material as that of the first intermediate line.

24. A display apparatus comprising:
a substrate comprising a bending area between a first area and a second area to be bent in the bending area about a bending axis;
a first intermediate line at least partially located in the bending area, and located over a lower surface of the substrate, wherein the lower surface of the substrate is an internal surface in the bending area;
a first upper line over an upper surface of the substrate to be electrically connected to the first intermediate line via a first contact hole in the substrate; and
a lower protective film covering the lower surface of the substrate and the first intermediate line.

25. The display apparatus of claim 24, wherein the first upper line is at least partially located in the first area.

26. The display apparatus of claim 24, wherein the first area comprises a display area, and an end of the first intermediate line in a direction towards the display area is closer to the display area than the first contact hole.

27. The display apparatus of claim 24, wherein a portion of the first intermediate line, which corresponds to the first contact hole, has a width that is greater than a width of the other portion of the first intermediate line.

28. The display apparatus of claim 24, further comprising:
a second intermediate line at least partially located in the bending area, and arranged over the lower surface of the substrate, wherein the lower surface of the substrate is the internal surface in the bending area; and
a second upper line at least partially located in the first area to be electrically connected to the second intermediate line via a second contact hole in the substrate.

29. The display apparatus of claim 28, wherein the portion of the first intermediate line overlapping the first contact hole and the portion of the second intermediate line overlapping the second contact hole are not adjacent to each other in a direction crossing a direction in which the first intermediate line and the second intermediate line extend.

30. The display apparatus of claim 28, wherein, in the first intermediate line, a portion overlapping the first contact hole has a width that is greater than a width of the other portion of the first intermediate line, and in the second intermediate line, a portion overlapping the second contact hole has a width that is greater than a width of the other portion of the second intermediate line, and
wherein the portion of the first intermediate line overlapping the first contact hole and the portion of the second intermediate line overlapping the second contact hole are not adjacent to each other in a direction crossing a direction in which the first intermediate line and the second intermediate line extend.

31. The display apparatus of claim 24, further comprising a first additional line at least partially located in the second area, and arranged over the upper surface of the substrate to be electrically connected to the first intermediate line via a first additional contact hole in the substrate.

32. The display apparatus of claim 31, further comprising:
a second intermediate line at least partially located in the bending area, and arranged over the lower surface of the substrate, wherein the lower surface of the substrate is the internal surface in the bending area; and
a second additional line over the upper surface of the substrate to be electrically connected to the second intermediate line via a second additional contact hole in the substrate.

33. The display apparatus of claim 32, wherein, in the first intermediate line, a portion overlapping the first additional contact hole has a width that is greater than a width of the other portion of the first intermediate line, and in the second intermediate line, a portion overlapping the second additional contact hole has a width that is greater than a width of the other portion of the second intermediate line, and
wherein the portion of the first intermediate line overlapping the first additional contact hole and the portion of the second intermediate line overlapping the second additional contact hole are not adjacent to each other in a direction crossing a direction in which the first intermediate line and the second intermediate line extend.

34. The display apparatus of claim 32, wherein the portion of the first intermediate line overlapping the first additional contact hole and the portion of the second intermediate line overlapping the second additional contact hole are not adjacent to each other in a direction crossing a direction in which the first intermediate line and the second intermediate line extend.

35. The display apparatus of claim 31, wherein the portion of the first intermediate line overlapping the first additional contact hole has a width that is greater than a width of the other portion of the first intermediate line.

36. The display apparatus of claim 24, wherein the first area comprises a display area, and the first upper line is electrically connected to a display device located in the display area.

37. The display apparatus of claim 24, wherein the first area comprises a display area, and the display area is throughout the first area, the bending area, and the second area.

38. The display apparatus of claim 37, further comprising a data line and a scan line that cross each other in the display area, wherein one of the data line and the scan line is the first upper line, and the first upper line is connected to the first intermediate line in a region where the data line and the scan line cross each other such that the data line and the scan line do not directly contact each other.

39. The display apparatus of claim 24, further comprising:
a thin film transistor over the second substrate to be located in at least one of the first area, the bending area, and the second area; and
a shielding layer located between the first substrate and the second substrate to correspond to the thin film transistor to prevent external light from reaching the thin film transistor,
wherein the shielding layer includes a same material as that of the first intermediate line.

* * * * *